United States Patent
Ishihara et al.

[11] Patent Number: 5,880,911
[45] Date of Patent: Mar. 9, 1999

[54] MAGNETORESISTIVE EFFECT ELEMENT

[75] Inventors: Kunihiko Ishihara; Hidefumi Yamamoto; Kazuhiko Hayashi; Jun-Ichi Fujikata, all of Tokyo, Japan

[73] Assignee: NEC Corporation, Tokyo, Japan

[21] Appl. No.: 882,229

[22] Filed: Jun. 25, 1997

Related U.S. Application Data

[63] Continuation of Ser. No. 409,582, Mar. 24, 1995, abandoned.

[30] Foreign Application Priority Data

| Mar. 24, 1994 | [JP] | Japan | 6-053688 |
| May 27, 1994 | [JP] | Japan | 6-115502 |
| Jul. 14, 1994 | [JP] | Japan | 6-162239 |
| Sep. 6, 1994 | [JP] | Japan | 6-212478 |

[51] Int. Cl.$^6$ .............. G11B 5/39; H01L 43/08; G01R 33/09
[52] U.S. Cl. ................ 360/113; 338/32 R; 324/252
[58] Field of Search ................ 360/113, 125, 360/126; 338/32 R; 324/252

[56] References Cited

U.S. PATENT DOCUMENTS

| 4,354,212 | 10/1982 | Nouchi et al. | 360/113 |
| 4,803,581 | 2/1989 | Kira et al. | 360/113 |
| 5,126,902 | 6/1992 | Takahashi et al. | 360/113 |
| 5,327,313 | 7/1994 | Nishioka et al. | 360/113 |
| 5,337,203 | 8/1994 | Kitada et al. | 360/113 |
| 5,406,433 | 4/1995 | Smith | 360/113 |
| 5,461,526 | 10/1995 | Hamakawa et al. | 360/113 |
| 5,465,186 | 11/1995 | Bajorek et al. | 360/113 |
| 5,469,317 | 11/1995 | Nagata et al. | 360/113 |
| 5,698,335 | 12/1997 | Iwasaki et al. | 360/113 |

FOREIGN PATENT DOCUMENTS

| 0490327 | 6/1992 | European Pat. Off. . |
| 4-218982 | 8/1992 | Japan . |

OTHER PUBLICATIONS

B. Dieny et al., "Giant magnetoresistance in soft ferromagnetic multilayers", *Rapid Communications,* vol. 43, No. 1, Jan. 1, 1991, pp. 1297–1300.

Patent Abstracts of Japan, vol. 9, No. 207 (P–382), 60–69808, Apr. 20, 1995.

B. Dieny et al., "Giant magnetoresistance in soft ferromagnetic multilayers", *Physical Review B,* vol. 43, No. 1, Jan. 1, 1991, pp. 1297–1300.

*Primary Examiner*—David L. Ometz
*Attorney, Agent, or Firm*—Sughrue, Mion, Zinn, Macpeak & Seas, PLLC

[57] ABSTRACT

The magnetoresistive effect element in accordance with the invention has several aspects. For instance, the magnetoresistive effect element includes an artificial lattice multilayered structure composed of a thin magnetic layer and a non-magnetic layer at least once successively deposited, and a bias field applying device for applying a bias magnetic field to the artificial lattice multilayered structure so that an orientation of residual magnetization of one of the thin magnetic layers having a greater coercive force than that of an adjacent thin magnetic layer, is the same as an orientation of a bias magnetic field to be applied to the artificial lattice multilayered structure. The magnetoresistive effect element provides enhanced regenerated outputs and also improves the symmetry of regenerated waveforms.

21 Claims, 14 Drawing Sheets

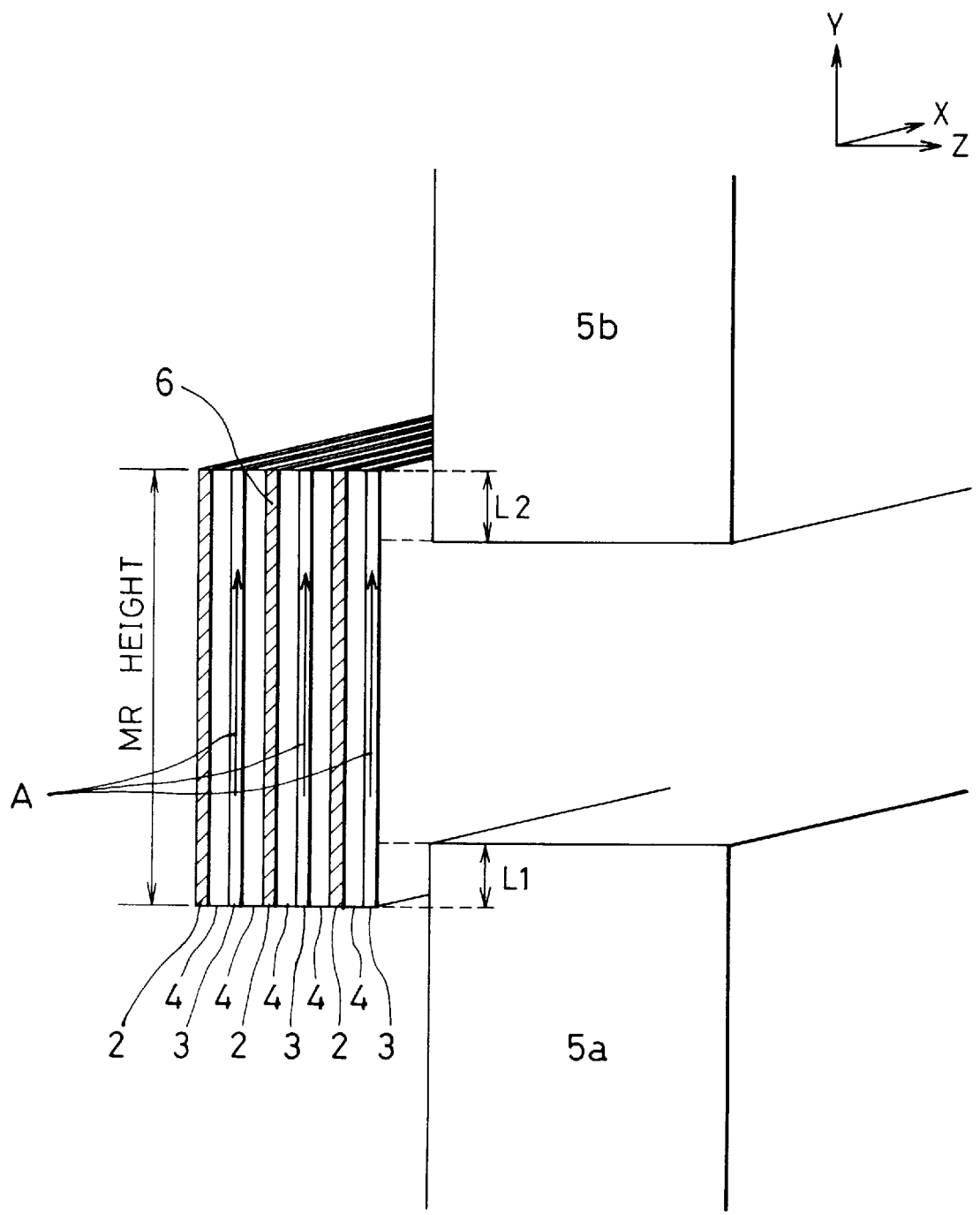

MAGNETORESISTIVE EFFECT ELEMENT

This is a continuation of application Ser. No. 08/409,582 filed Mar. 24, 1995, abandoned.

BACKGROUND OF THE INVENTION

1. Field of the Invention

The invention relates to a magnetoresistive effect element for reading out a magnetic field intensity as a signal in magnetic substances such as magnetic medium.

2. Description of the Related Art

Recently, there has been developed the improvement of sensitivity of a magnetic sensor and the densification in magnetic recording, and following such development, there has also developed a magnetoresistive effect type magnetic sensor (hereinafter, referred to simply as a MR sensor) and a magnetoresistive effect type magnetic head (hereinafter, referred to simply as a MR head). Both of a MR sensor and a MR head read out external magnetic field signals in accordance with a change in a resistance of a reading sensor composed of magnetic material. Both of a MR sensor and a MR head have a characteristic that a relative speed to a recording medium is not dependent on generated outputs. Hence, a MR sensor can obtain a high sensitivity, and a MR head can obtain a high output even in highly densified magnetic record.

Japanese Patent Public Disclosure No. 4-218982 laid open to the public on Aug. 10, 1992 has suggested an artificial lattice magnetoresistive effect layered structure which has a multilayered structure composed of a magnetic layer and a non-magnetic layer successively deposited and which exhibits a large change in magnetic resistance generated even for a small external field. In this artificial lattice magnetoresistive effect layered structure, a magnetic layer has a different coercive force from that of a magnetic layer deposited adjacent thereto via a nonmagnetic layer. A magnetoresistive effect element disclosed in the above mentioned Disclosure exhibits a few percents to tens of percents of resistance change rate even for an external magnetic field having an intensity ranging from a few of Oe to tens of Oe.

Though the magnetoresistive effect element can operate even with a small external magnetic field, it is necessary to apply an external bias magnetic field to the magnetoresistive effect element to obtain symmetrical regenerated waveforms of signals, if the magnetoresistive effect element is to be used as a practical sensor or magnetic head.

There has been reported another magnetoresistive effect layered structure in Physical Review B, Vol. 43, No. 1, 1991, page 1297, published by The American Physical Society. This magnetoresistive effect element has a structure comprising at least two thin magnetic layers separated by a non-magnetic thin interlayer. Adjacent to one of the soft thin magnetic layers is disposed a thin antiferromagnetic layer to provide anti-magnetic force thereto to thereby cause rotation of magnetization therein with an external magnetic field which is different from that of the other soft thin magnetic layer disposed adjacent to the one of the soft thin magnetic layer via a non-magnetic layer. Thus, a change in resistance is caused.

The above mentioned report has suggested, as a practical MR head, a magnetoresistive effect element having a structure comprising a soft magnetic layer, a non-magnetic insulator, a multlayered structure, a non-magnetic insulator and a soft magnetic layer successively deposited in this order. However, the magnetoresistive effect element has problems such that regenerated waves have a quite asymmetrical waveform, and that there is a fear that the magnetoresistive effect element may corrode because the magnetoresistive effect element is exposed to an ABS plane. If a magnetoresistive effect element is designed so that it is separated from the ABS plane, and an external magnetic field is introduced to the magnetoresistive effect element through a soft magnetic yoke, the symmetry of regenerated waveforms are considerably improved to thereby eliminate a fear of the corrosion of the magnetoresistive effect element.

SUMMARY OF THE INVENTION

In view of the foregoing problems of prior magnetoresistive effect elements, it is an object of the present invention to provide a magnetoresistive effect element capable of providing the enhancement of regenerated outputs thereof and also improving the symmetry of waveforms of regenerated waves.

In one aspect, the invention provides a magnetoresistive effect element that includes (a) an artificial lattice multilayered structure having a thin magnetic layer and a non-magnetic layer at least once successively deposited, one of the magnetic thin layers having a coercive force $H_{C2}$, and another thin magnetic layer deposited adjacent to the one of the thin magnetic layer through the non-magnetic layer, having a coercive force $H_{C3}$ which is greater than the coercive force $H_{C2}$ ($0<H_{C2}<H_{C3}$), and (b) a bias field applying device for applying a bias magnetic field to the artificial lattice magnetoresistive effect layered structure so that an orientation of residual magnetization of the another thin magnetic layer is the same as an orientation of a bias magnetic field to be applied to the artificial lattice magnetoresistive effect layered structure.

In another aspect, the invention provides a magnetoresistive effect element that includes (a) an artificial lattice multilayered structure having a first thin magnetic layer, a thin non-magnetic layer, a second thin magnetic layer and a thin antiferromagnetic layer at least once successively deposited in this order, and (b) a bias field applying device for applying a bias magnetic field to the artificial lattice magnetoresistive effect layered structure so that an orientation of magnetization of a thin magnetic layer a bias of which is exchanged by the thin antiferromagnetic layer is the same as an orientation of a bias magnetic field to be applied to the artificial lattice magnetoresistive effect layered structure.

In a preferred embodiment, the bias field applying device includes a shunt layer, a separation of which cause a magnetic field. The shunt layer is composed of a non-magnetic layer having a thickness ranging from 2 nm to 20 nm, both inclusive.

In another preferred embodiment, the bias field applying device includes a permanent magnet for producing a magnetic field. The permanent magnet has a residual magnetic flux density ranging from 1000 G to 5000 G both inclusive.

In still another preferred embodiment, the bias field applying device includes a device for generating an induction field by means of an electrical current.

In yet another preferred embodiment, the bias field applying device includes a soft magnetic film which generates a leakage magnetic field.

In still yet another preferred embodiment, the bias field applying device includes a device for running a sense current through two of the artificial lattice multilayered structure to thereby generate a bias magnetic field.

In still another aspect, the invention provides a magnetoresistive effect element that includes (a) an artificial lattice multilayered structure having a thin magnetic layer and a non-magnetic layer at least once successively deposited at least two times, one of the magnetic thin layers having a coercive force $H_{C2}$, and another thin magnetic layer deposited adjacent to the one of the thin magnetic layer through the non-magnetic layer, having a coercive force $H_{C3}$ which is greater than the coercive force $H_{C2}$ ($0<H_{C2}<H_{C3}$), (b) yokes positioned relative to the artificial lattice multilayered structure with a non-magnetic insulating layer disposed between the yokes and the artificial lattice multilayered structure, (c) and a device for applying an electrical current to the artificial lattice multilayered structure so that the electrical current runs in a negative direction of an X axis. Herein, the X axis is defined so that a Y axis is defined to be a magnetization orientation when a magnetic field is equal to zero after a magnetization of another thin magnetic layer has been saturated, and a Z axis is defined to be a direction from the artificial lattice multilayered structure towards the yoke perpendicularly to the artificial lattice multilayered structure.

In yet another aspect, the invention provides a magnetoresistive effect element that includes (a) an artificial lattice multilayered structure having a thin magnetic layer and a non-magnetic layer at least once successively deposited, and (b) yokes disposed so that the yokes are overlapped with the artificial lattice multilayered structure at opposite ends of the multilayered structure, with a non-magnetic insulating layer disposed between the yokes and the artificial lattice multilayered structure. An overlapping portion of the yokes with the artificial lattice multilayered structure is adapted to have a length up to 2.0 $\mu$m inclusive.

In still yet another preferred embodiment, a magnetoresistive effect element that includes (a) an artificial lattice multilayered structure having a thin magnetic layer and a non-magnetic layer at least once successively deposited, and (b) yokes positioned relative to the artificial lattice multilayered structure with a non-magnetic insulating layer disposed between the yokes and the artificial lattice multilayered structure. The artificial lattice multilayered structure has a magnetoresistive height up to 10 $\mu$m inclusive.

In further another aspect, the invention provides a magnetoresistive effect element including (a) an artificial lattice multilayered structure having a thin magnetic layer and a non-magnetic layer at least once successively deposited, and (b) a ring-shaped yoke positioned relative to the artificial lattice multilayered structure with a non-magnetic insulating layer disposed between the yoke and the artificial lattice multilayered structure. A distance between a surface from which a magnetic field is to be detected and the artificial lattice multilayered structure is set to be greater than a gap depth of the ring-shaped yoke, and the gap depth is up to 5 $\mu$m inclusive.

In the magnetoresistive effect element in accordance with invention, the multilayered structure may further have another magnetic layer and a thin antiferromagnetic layer so that the multilayered structure is composed of a thin magnetic layer, a thin non-magnetic layer, a thin magnetic layer and a thin antiferromagnetic layer at least once successively deposited in this order.

Furthermore, the multilayered structure may further have a metallic thin layer so that the multilayered structure is composed of a metallic thin layer, a thin magnetic layer, a thin non-magnetic layer, a thin magnetic layer and a thin antiferromagnetic layer at least once successively deposited in this order.

In the above mentioned magnetoresistive effect layered structure disclosed in Japanese Patent Public Disclosure No. 4-218982, a difference in coercive forces of thin magnetic layers disposed adjacent to each other via a nonmagnetic layer causes orientation of magnetization of magnetic layers positioned adjacent to each other by an external magnetic field, to change parallelism to antiparallelism to thereby cause a change in resistance. In other words, supposing that each of adjacent magnetic layers has a coercive force $H_{C2}$ and $H_{C3}$ ($0<H_{C2}<H_{C3}$), respectively, when an intensity H of an external magnetic field is between the coercive forces $H_{C2}$ and $H_{C3}$ ($H_{C2}<H<H_{C3}$), orientation of magnetization of the adjacent thin magnetic layers become opposite to each other, thereby a resistance is increased. Thus, the magnetization of the thin magnetic layer having a coercive force $H_{C3}$ is to be first saturated in order to cause a magnetoresistive effect element to operate properly.

In addition, in the multilayered structure in question, an exchange bias force is generated by forming a thin antiferromagnetic layer adjacent to one of deposited magnetic layers between which a non-magnetic layer is sandwiched. The thus generated exchange bias force causes orientation of magnetization of adjacent magnetic layers to change from parallelism to antiparallelism to thereby cause a resistance variation. In other words, supposing that a thin magnetic layer a bias of which is exchanged by a thin antiferromagnetic layer has anti-magnetic force Hex and an other thin magnetic layer has a coercive force $H_{C2}$ ($0<H_{C2}<$Hex), when an external magnetic field has the intensity H intermediate between $H_{C2}$ and Hex ($H_{C2}<H<$Hex), the orientation of magnetization of the adjacent magnetic layers become opposite to each other, thereby a resistance is increased.

In the multilayered structure composed of finely formed artificial lattice, there occurs magnetostatic coupling at ends of the multilayered structure between adjacent thin magnetic layers between which a non-magnetic thin interlayer is sandwiched. Hence, even if an external magnetic field has an intensity of zero, the magnetization of adjacent magnetic layers is caused to be antiparallel to each other at ends of a multilayered structure. That is, the thin magnetic layer having a coercive force $H_{C2}$ has the magnetization distribution in which the magnetization is being gradually saturated from a center of the layer towards ends of the layer in the width-wise direction of finely formed pattern. Thus, the dynamic range to an external magnetic field is rather small at ends of the multilayered structure. This is the reason for asymmetry of regenerated waveforms in a sensor or a magnetic head.

A magnetic thin film having a coercive force $H_{C2}$ has an excessive bias magnetic field at ends thereof due to a thin magnetic layer having a coercive force $H_{C3}$ or a thin magnetic layer a bias of which is exchanged by a thin antiferromagnetic layer. In order to improve this asymmetry, it is preferable to apply a bias magnetic field to the multilayered structure to thereby suppress the influence of magnetostatic coupling in a thin magnetic layer having a coercive force $H_{C2}$. In applying such a bias magnetic field, it is indispensable to cause an orientation of such a bias magnetic field to be the same as an orientation of residual magnetization of a thin magnetic layer having a coercive force $H_{C3}$ or an orientation of magnetization of a thin magnetic layer, a bias of which is exchanged by a thin antiferromagnetic layer. A system for applying a bias magnetic field to a magnetoresistive effect element can be selected among a shunt bias system, an induction field system using a current, a permanent magnet bias system, a soft film bias system and an alternate bias system.

The shunt bias system has a non-magnetic conductive layer formed on a multilayered structure. A bias magnetic field is applied to magnetoresistive effect element by a magnetic field generated by a sense current splitting to the non-magnetic conductive layer. This system has advantages that the system has a simple structure and hence can be easily constructed.

In the induction field system, a non-magnetic conductive layer is formed on a multilayered structure with a non-magnetic insulating layer being sandwiched between the layers, and a bias magnetic field is applied to a magnetoresistive effect element by running an electrical current through the non-magnetic conductive layer.

The permanent magnet bias system has one or more permanent magnet(s) disposed in the vicinity of a multilayered structure to thereby apply to a bias magnetic field to a magnetoresistive effect element with a leakage magnetic field leaked from the permanent magnet(s). This system utilizes magnetostatic coupling between a permanent magnet and a multilayered structure to thereby create a bias magnetic field, and thus can provide a multilayered structure at ends thereof with a bias magnetic field having a greater intensity. As aforementioned, a magnetic thin film having coercive force $H_{C2}$ has an excessive bias magnetic field at ends thereof due to a thin magnetic layer, a bias of which is exchanged by a thin antiferromagnetic layer. Hence, this system is preferable for offsetting the excessive magnetic field.

The soft film bias system utilizes magnetic conjunction of a multilayered structure with a soft magnetic layer disposed adjacent to the multilayered structure. The soft magnetic layer is magnetized by a magnetic field generated by a sense current running through a multilayered structure, and a bias magnetic field is applied to a multilayered structure with a leakage magnetic field leaked from the magnetized soft magnetic layer. This system can provide a large bias field at ends of a multilayered structure, and thus is similarly preferable like the permanent magnet bias system.

The alternate bias system uses two multilayered structures. A bias magnetic field is applied alternately to a magnetoresistive effect element with magnetic fields generated by running a sense current through each of the multilayered structures. This system enables obtaining double outputs or operating a magnetoresistive effect element as a differential element by operating both of the two multilayered structures as a magnetoresistive effect element.

It is possible to use at least two systems among the above mentioned shunt bias system, induction field system permanent magnet system, soft film bias system and alternate bias system.

As aforementioned, even if an external magnetic field has an intensity of zero, the magnetization of adjacent magnetic layers is caused to be antiparallel to each other at ends of a multilayered structure. That is, the thin magnetic layer having a coercive force $H_{C2}$ has the magnetization distribution in which the magnetization is being gradually saturated from a center of the layer towards ends of the layer in the width-wise direction of a finely formed pattern. On the other hand, a current field generated by an electrical current running through a multilayered structure considerably affects the magnetization of the thin magnetic layer having a coercive force $H_{C2}$. In a case of a MR head having a yoke, since a yoke composed of soft magnetic substance is disposed at only one side of a multilayered structure, a magnetic field generated by an electrical current running through a multilayered structure is affected by the yoke to thereby have asymmetrical distribution. The magnetization distribution of a thin magnetic layer having a coercive force $H_{C2}$ is affected by an asymmetric electrical current field to thereby have a difference dependent on a direction in which an electrical current runs. Thus, the distribution of magnetization orientation of thin magnetic layers disposed adjacent to each other varies dependent on a direction in which an electrical current runs, thereby creating a difference in regenerated outputs.

Hereinbelow will be explained, with reference to FIG. 1, a positional relationship between a multilayered structure and a yoke and also a relationship between an orientation of residual magnetization of a thin magnetic layer having a coercive force $H_{C3}$ and a direction in which an electrical current runs. A magnetoresistive effect film is composed of a first thin magnetic layer 2, a non-magnetic layer 4, a second thin magnetic layer 3, and a second thin non-magnetic layer 4 successively deposited three times in this order. The first thin magnetic layer 2 has a coercive forces $H_{C2}$ and the second thin magnetic layer 3 has a coercive force $H_{C3}$ which is greater than the coercive force $H_{C2}$ ($0<H_{C2}<H_{C3}$). An electrical current is run in a positive or negative direction of a X axis which is defined so that a Y axis is defined to be an orientation of residual magnetization of the second thin magnetic layer 3, and a Z axis is defined to be a direction from the multilayered structure towards yokes 5a and 5b perpendicularly to a surface of the first and second thin magnetic layers 2 and 3. That is, the magnetization of the second thin magnetic layer 3 is oriented in a direction indicated by an arrow A. A width of finely formed pattern of a magnetoresistive effect element corresponds to a magnetoresistive (MR) height as illustrated in FIG. 1. When no electrical current runs through the multilayered structure, the orientation of magnetization of the first and second thin magnetic layers 2 and 3 is antiparallel to each other at ends of the multilayered structure due to magnetostatic coupling. That is, the magnetization of the first thin magnetic layer 2 tends to be directed toward a negative direction of the Y axis. Hence, the magnetization of the first thin magnetic layer 2 is distributed so that the ends thereof have a greater degree of orientation toward a negative direction of the Y axis than the center thereof. Hereinbelow will be explained the magnetization orientation of the first thin magnetic layer 6 located at the center of the plurality of first thin magnetic layers 2.

Supposing that an electrical current is applied in a positive direction of the X axis, a current field generated by an electrical current running through the non-magnetic thin layers 4 disposed closer to the yokes 5a and 5b than the magnetic layer 6 is gathered in the vicinity of the yokes 5a and 5b because the yokes 5a and 5b are composed of magnetic material having high magnetic permeability. On the other hand, a current field generated by an electrical current running through the non-magnetic thin layers 4 disposed farther away from the yoke than the magnetic layer 6 is scarcely affected by the yokes 5a and 5b, and thus the magnetic layer 6 has a greater degree of orientation toward a negative direction of the Y axis at the center thereof. As a result, a variation in magnetization orientation of the magnetic layer 6 relative to a variation of an external magnetic field is suppressed in a negative direction of the Y axis at the center of the multilayered structure which have highest sensitivity to a magnetic field, thereby regenerated outputs are caused to be smaller.

To the contrary, when a current is applied in a negative direction of the X axis, the magnetization at the center of the multilayered structure is distributed so that the magnetization weakens magnetostatic coupling. Thus, comparing to a case in which a current is applied in a positive direction of the X axis, a variation in magnetization of the magnetic layer 6 relative to a variation of an external magnetic field is not suppressed, thereby regenerated outputs are amplified. In addition, the symmetry of regenerated waveforms are improved.

The dependency of regenerated outputs on a direction in which a current runs due to the asymmetry of a current field generated because of presence of the yokes 5a and 5b is found only when the magnetic thin layer 2 is sandwiched by the non-magnetic thin layers 4. Thus, the repeat number of deposition in the multilayered structure has to be at least two.

Hereinbelow will be explained as to overlapping length of the multilayered structure and the yoke, and also as to the MR height. In a magnetoresistive effect element having a yoke, a magnet flux generated from a magnetic medium is introduced from the front yoke 5a to the multilayered structure, and then to the rear yoke 5b. As aforementioned, the magnetostatic coupling causes the dynamic range to be smaller at the ends of the multilayered structure relative to a magnetic field generated by the magnetic medium. Hence, it is necessary for considerably enhancing regenerated outputs to prevent a magnetic field having a large intensity from directly entering the ends of the multilayered structure by covering the ends with the yokes 5a and 5b to thereby introduce magnetic flux to the center of the multilayered structure having a large dynamic range. What is required for the enhancement of regenerated outputs is to overlap the multilayered structure with the front and rear yokes 5a and 5b for covering only the ends of the multilayered structure which is affected by magnetostatic coupling. Thus, excessively overlapping disadvantageously results in the deterioration of regenerated outputs. That is, the overlapping lengths L1 and L2 of the multilayered structure with the yokes 5a and 5b have optimal values regardless of the MR height w of the multilayered structure.

If the MR height w is designed to be 10 $\mu$m or greater, the leakage of magnetic flux from the multilayered structure occurs remarkably, and hence the multilayered structure is not entirely magnetized efficiently. As a result, regenerated outputs are deteriorated.

On the other hand, the magnetization of the thin magnetic layer 2 having a coercive force $H_{C2}$ is considerably affected by a current field generated by a sense current running through the multilayered structure. For instance, now supposing an artificial lattice structure composed of NiFe, Cu, Co and Cu successively deposited in this order, NiFe has 7 $\mu\Omega$·cm, Cu has 1.4 $\mu\Omega$·cm, and Co has 14 $\mu\Omega$·cm of bulk resistivity at room temperature (RT), and it is considered that a sense current runs mainly through the Cu non-magnetic layer. Herein, supposing that the repeat number N of the deposition in the multilayered structure is three. Even if there does not exist an external magnetic field, a current field causes the magnetization of the firstly and thirdly deposited magnetic layers is antiparallel to each other. The antiparallelism shows that the firstly and thirdly deposited magnetic layers 2 are difficult to react with an external magnetic field. Supposing that a current density of a sense current running through the multilayered structure is kept constant, as the repeat number N is made greater, the influence of a current field becomes larger, thereby the firstly and lastly deposited magnetic layers 2 are made more difficult to react with an external magnetic field with the result that the regenerated outputs are deteriorated. Thus, the repeat number N is preferable to be five or smaller.

In the case that a magnetoresistive effect element having ring-shaped yokes is to be used, it is possible to reduce the leakage of magnetic flux from the multilayered structure to a lower yoke by setting a distance between a surface from which a magnetic field is to be detected and the multilayered structure to be larger than a gap depth of the ring-shaped yokes. In addition, it is possible to reduce the leakage of magnetic flux from a front yoke to a lower yoke through the gap by setting the gap depth to be 5 $\mu$m or shorter.

In accordance with the magnetoresistive effect element explained so far, it is possible to enhance regenerated outputs of the magnetoresistive effect element and further improve the symmetry of waveforms of regenerated waves.

The above and other objects and advantageous features of the present invention will be made apparent from the following description made with reference to the accompanying drawings, in which like reference characters designate the same or similar parts throughout the drawings.

BRIEF DESCRIPTION OF THE DRAWINGS

FIG. 1 is a perspective cross-sectional view illustrating a magnetoresistive effect element.

DESCRIPTION OF THE PREFERRED EMBODIMENTS

Preferred embodiments in accordance with the present invention will be explained hereinbelow with reference to drawings.

[Embodiment 1]

Figure 2A:
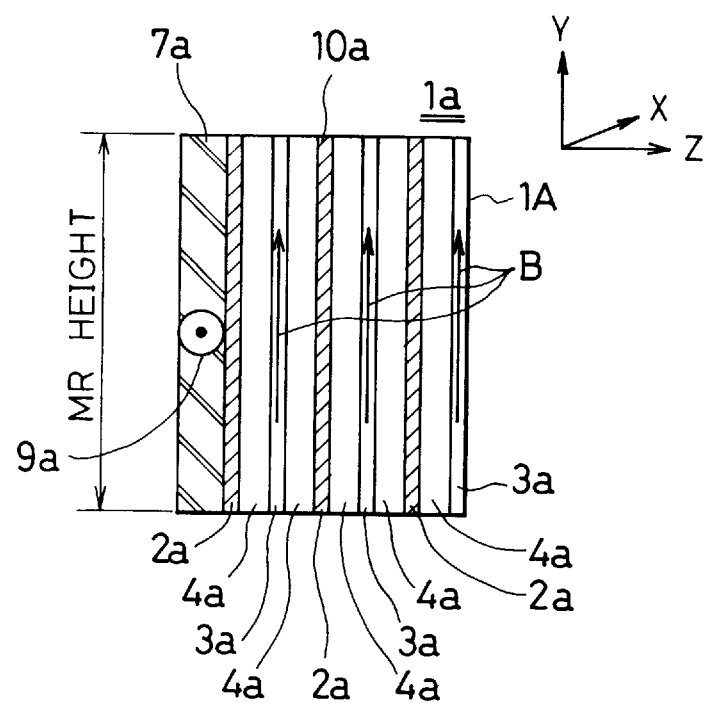
FIG. 2A is a cross-sectional view illustrating a first embodiment of the magnetoresistive effect element in accordance with the invention.

FIG. 2A illustrates a first embodiment of the magnetoresistive effect element in which the shunt bias system is adopted. As illustrated, a magnetoresistive effect element 1a is constructed as an artificial lattice magnetoresistive effect element which has a multilayered structure 1A including a thin magnetic layer 2a composed of NiFe and 1.5 nm thick, a thin non-magnetic layer 4a composed of Cu and 3.5 nm thick, a thin magnetic layer 3a composed of Co and 1.5 nm thick, and a thin non-magnetic layer 4a composed of Cu and 3.5 nm thick successively deposited in this order three times. The magnetoresistive effect element 1a has a finely formed pattern width corresponding to MR height as illustrated in FIG. 2A.

It should be noted that a last non-magnetic Cu layer 4a is not formed. The magnetoresistive effect element 1a further includes a non-magnetic conductive layer 7a composed of a thin Cu layer which is positioned adjacent to the thin magnetic layer 2a disposed at an end of the multilayered structure 1A. As shown in FIG. 2A, an X axis is defined so that the orientation B of residual magnetization of the thin magnetic layer 3a is a positive direction of a Y axis, and a direction from the non-magnetic conductive layer 7a to the thin magnetic layer 3a perpendicularly to an end surface of the multilayered structure 1A is a positive direction of a Z axis. By running a sense current in a negative direction 9a of the X axis, it is possible to apply a bias field to the multilayered structure 1A in a positive direction of the Y axis.

Figure 2B:
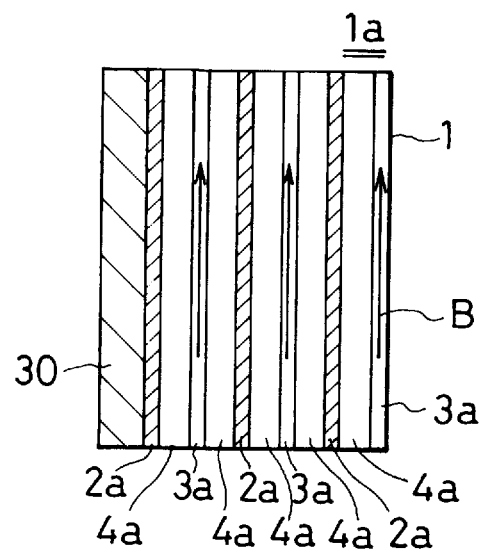
FIG. 2B is a cross-sectional view illustrating a variation of the first embodiment.

FIG. 2B is a variation of the above mentioned first embodiment. As illustrated, a permanent magnet 30 may be used in place of the non-magnetic conductive layer 7a through which a sense current is to run. The permanent magnet 30 also serves to apply a bias field to the multilayered structure 1A.

[Embodiment 2]

Figure 3:
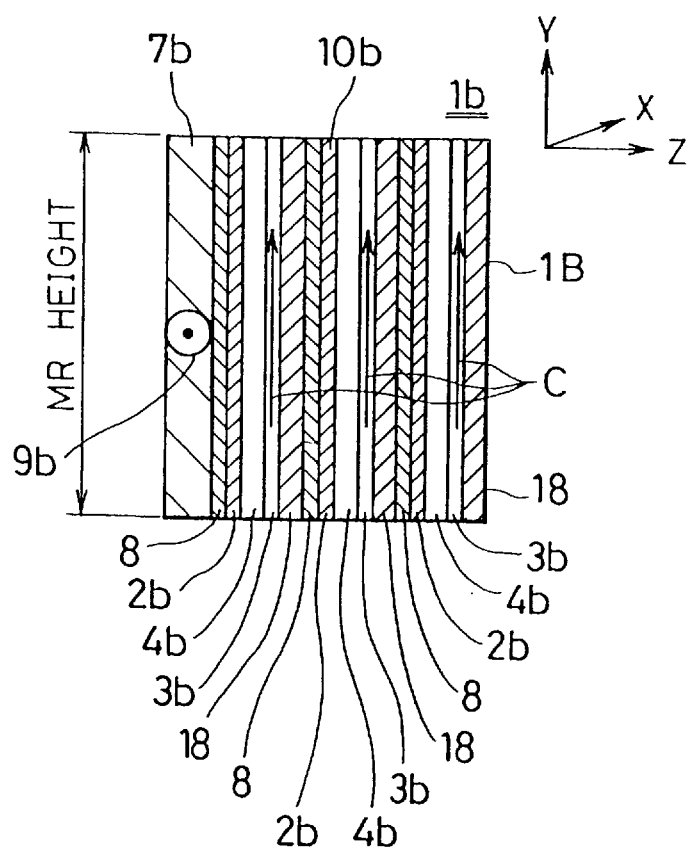
FIG. 3 is a cross-sectional view illustrating a second embodiment of the magnetoresistive effect element in accordance with the invention.

FIG. 3 illustrates a second embodiment of the magnetoresistive effect element adopting the shunt bias system. As illustrated, a magnetoresistive effect element 1b in accordance with the second embodiment is constructed as an artificial lattice magnetoresistive effect element which has a multilayered structure 1B including a thin metallic layer 8 composed of Cu and 3 nm thick, a thin magnetic layer 2b composed of NiFe and 5 nm thick, a thin non-magnetic layer 4b composed of Cu and 2.5 nm thick, a thin magnetic layer 3b composed of NiFe and 5 nm thick, and a thin antiferromagnetic layer 18 composed of FeMn and 10 nm thick successively deposited in this order three times. The magnetoresistive effect element 1b has a finely formed pattern width corresponding to MR height as illustrated in FIG. 3.

The magnetoresistive effect element 1b further includes a nonmagnetic conductive layer 7b composed of a thin Cu layer which is positioned adjacent to the thin metallic layer 8 disposed at an end of the multilayered structure 1B. As shown in FIG. 3, an X axis is defined so that the orientation C of the thin magnetic layer 3b which is exchanged a biased thereof by the thin antiferromagnetic layer 18 is a positive direction of a Y axis, and a direction from the non-magnetic conductive layer 7b to the multilayered structure 1B perpendicularly to an end surface of the multilayered structure 1B is a positive direction of a Z axis. By running a sense current in a negative direction 9b of the X axis, it is possible to apply a bias field to the multilayered structure 1B in a positive direction of the Y axis.

Figure 4A:
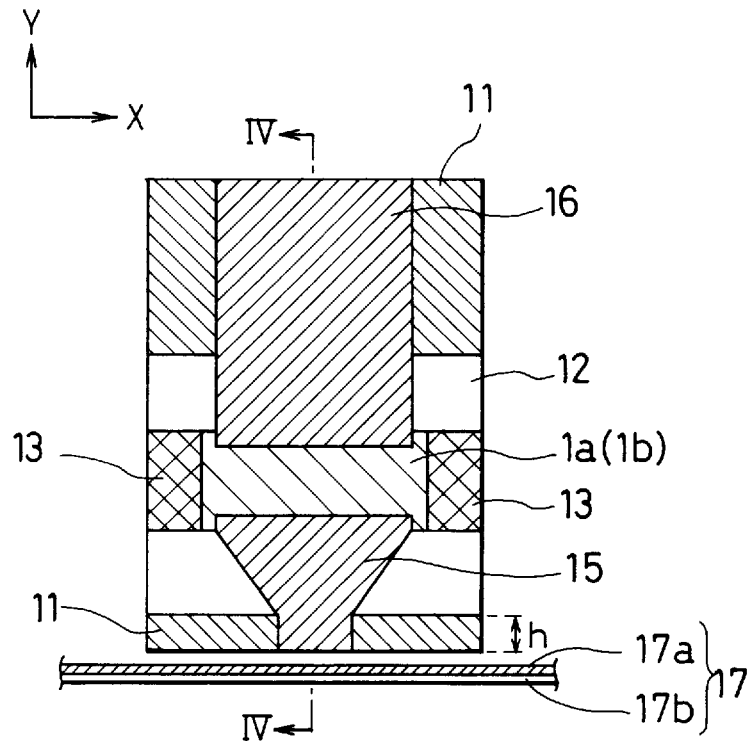
FIG. 4A is a front view illustrating a yoke-type MR head in which is incorporated a magnetoresistive effect element in accordance with the invention.
Figure 4B:
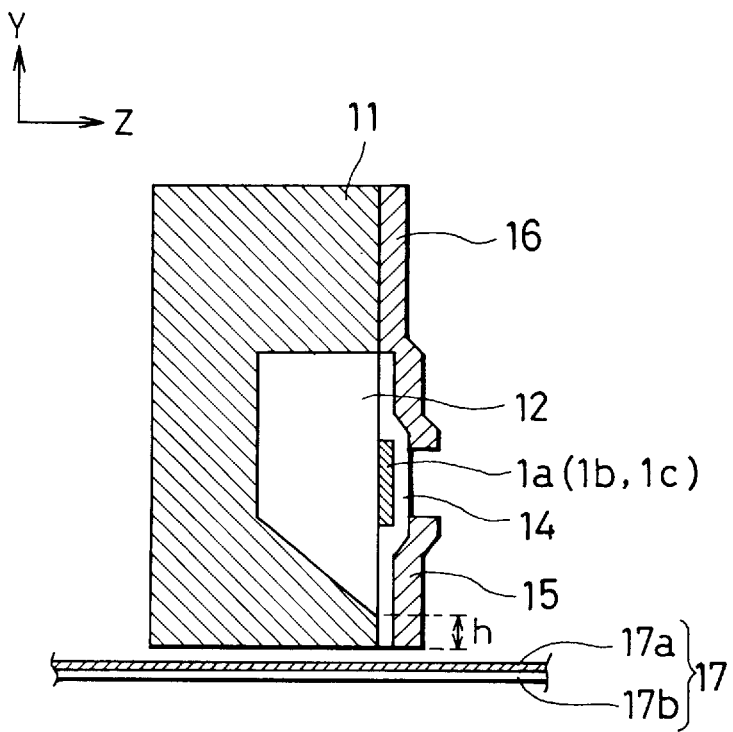
FIG. 4B is a cross-sectional view taken along the line IV—IV of FIG. 4A.

The measurements of regenerated outputs and waveforms were carried out by using a yoke-type MR head illustrated in FIGS. 4A and 4B into which the magnetoresistive effect element 1a or 1b are incorporated. With reference to FIGS. 4A and 4B, the yoke-type MR head includes a ferromagnetic substrate 11 which is composed of NiZn ferrite and constructing a back yoke. The ferromagnetic substrate 11 is formed with a recess which is 30 μm wide and 30 μm deep. The recess is filled with non-magnetic insulating material 12 such as glass. On the non-magnetic insulator 12 is formed the magnetoresistive effect element 1a or 1b having the MR height of 10 μm. A pair of yokes 15 and 16 is provided so that they overlap the magnetoresistive effect element 1a or 1b through electrodes 13 and a non-magnetic insulating layer 14. The electrodes 13 are composed of Au and 0.24 μm thick, and the non-magnetic insulating layer 14 is composed of SiO₂ and 0.2 μm thick. The yokes 15 and 16 are composed of NiFe and 1 μm thick. The overlapping portion of the magnetoresistive effect element 1a or 1b with the yokes 15 and 16 is 2 μm long.

It should be noted that the non-magnetic insulating layer 14 is omitted in FIG. 4A for making it easy to understand a positional relationship between the magnetoresistive effect element 1a or 1b and the yokes 15 and 16. A record medium 17 is composed of double layers comprising a perpendicular magnetic record layer 17a and an underlying layer 17b. The perpendicular magnetic record layer 17a is 0.1 μm thick, and has a record bit length of 1 μm. The underlying layer 17b is 0.05 μm thick. A spacing between the yoke-type MR head and the record medium 17 is set to be 0.02 μm.

Figure 5:
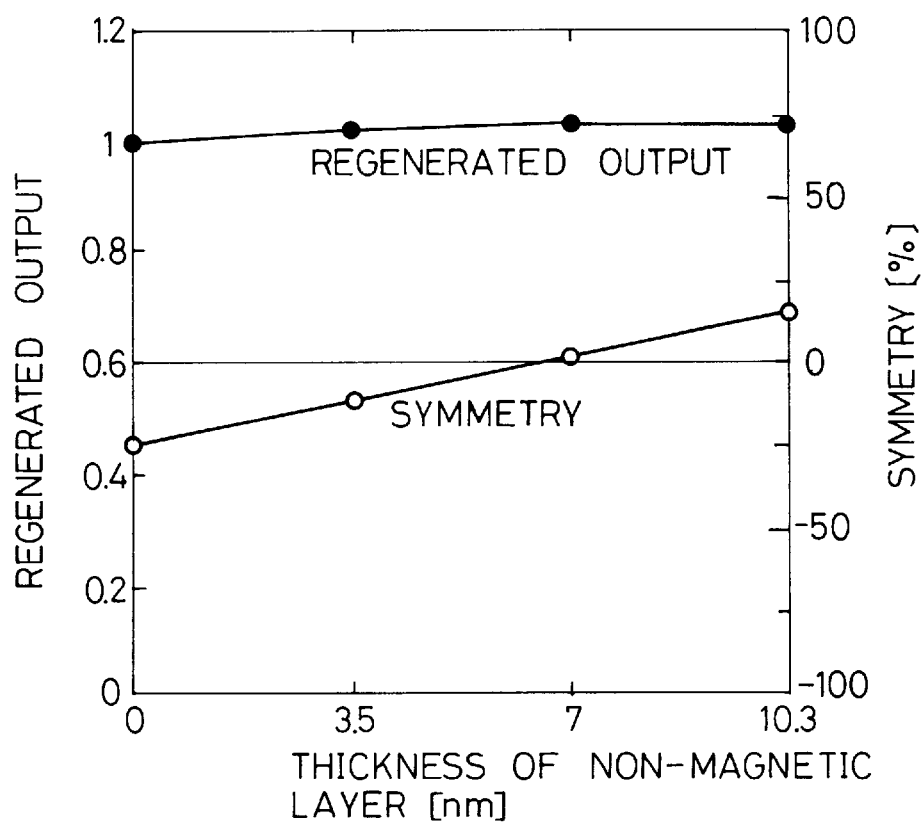
FIG. 5 is a graph showing the dependency of regenerated outputs and symmetry of regenerated waveforms on a bias field in a shunt bias system.

FIG. 5 shows regenerated outputs and symmetry of regenerated waveforms. The regenerated outputs are normalized ones. The intensity of a bias field was controlled by varying a thickness of the non-magnetic conductive layer 7a or 7b. FIG. 5 shows that the symmetry of regenerated waveforms is gradually improved by appliance of a bias field.

Hereinbelow will be explained the results of FIG. 5 from the viewpoint of the distribution of internal magnetization of the magnetoresistive effect element. The following is analysis of the magnetization relative to a change of a signal field due to the two layers deposited medium 17 of the yoke-type head to which the magnetoresistive effect element in accordance with the invention is applied. The analysis was carried out using an integral element method. In this analysis, it is supposed that a variation in an angle formed between the thin magnetic layers 2a or 2b and 3a or 3b disposed at opposite sides of the thin nonmagnetic layer 4a or 4b would cause magnetoresistive effect to occur. The resistivity $\rho$ of the thin non-magnetic layer 4a or 4b is calculated based on the following equation (A) in which $\rho_0$ represents the resistivity when a magnetic field has an intensity of zero and $\Delta\rho$ represents a variation of the resistivity.

$$\rho = \rho_0 - 0.5 \cdot \Delta\rho \cdot \cos\theta \tag{A}$$

Figure 6:
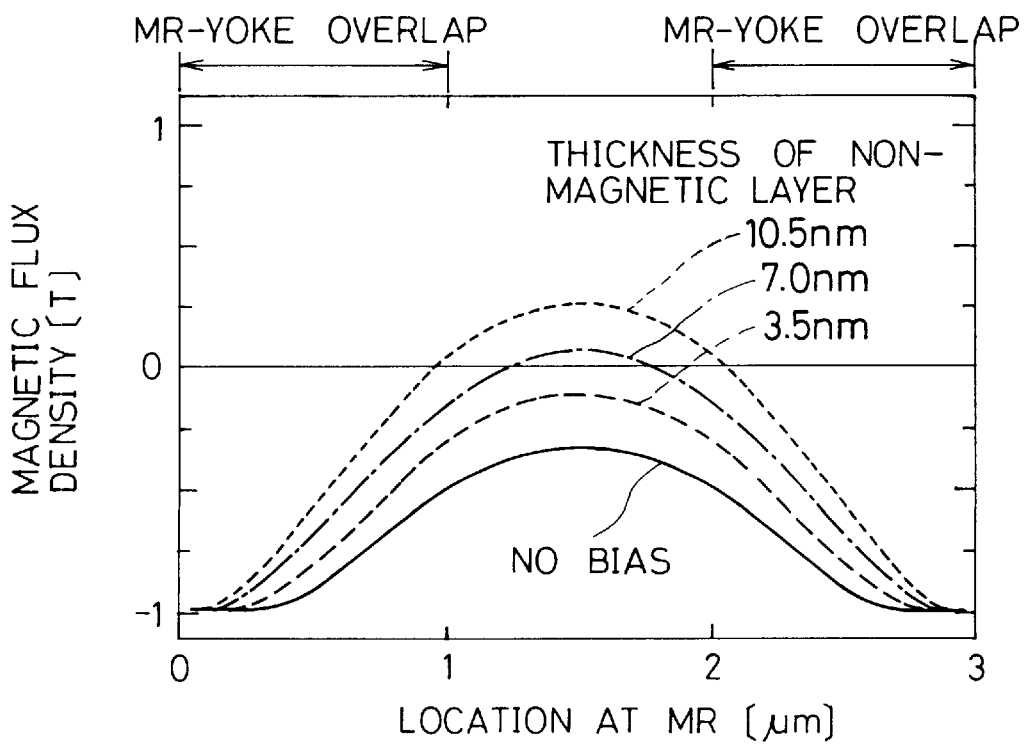
FIG. 6 is a graph showing the dependency of internal magnetization of the second layered thin magnetic layer on a bias field in a shunt bias system.

FIG. 6 shows internal magnetization of the second deposited magnetic layer 10a or 10b (see FIGS. 2 and 3) which is one of the thin magnetic layers 2a or 2b with a thickness of the non-magnetic conductive layer 7a or 7b being used as a parameter. There does not exist a magnetic field derived from the record medium 17. The MR height is set to be 3 $\mu$m, and the overlapping length of the magnetoresistive effect element 1a or 1b with the yokes 15 and 16 is set to be 1 $\mu$m. When a bias field is equal to zero in strength, the magnetization of the thin magnetic layer 10a or 10b is considerably affected at the ends thereof due to the magnetostatic coupling with the thin magnet layer 3a or 3b, and has a distribution in which the magnetization has the orientation opposite to that of the thin magnetic layer 3a or 3b. The magnetization of the thin magnetic layer 10a or 10b is directed in a negative direction even at the center of the multilayered structure 1A or 1B. The center of the multilayered structure 1A or 1B is affected by the magnetostatic coupling because the magnetoresistive effect element 1a or 1b has a small MR height.

It can be understood that when a bias field is applied to the magnetoresistive effect element, the influence of the magnetostatic coupling is offset as a bias field becomes more intensive. The intensity of the bias field is controlled by controlling a thickness of the non-magnetic conductive layer 7a or 7b. However, it has been found that a thickness of the non-magnetic conductive layer 7a or 7b for obtaining a bias field having a desired intensity may be varied in dependence on the MR height of the magnetoresistive effect element, and that the preferable range of the thickness of the non-magnetic layer conductive 7a or 7b is between 2 nm and 20 nm both inclusive.

Figure 7:
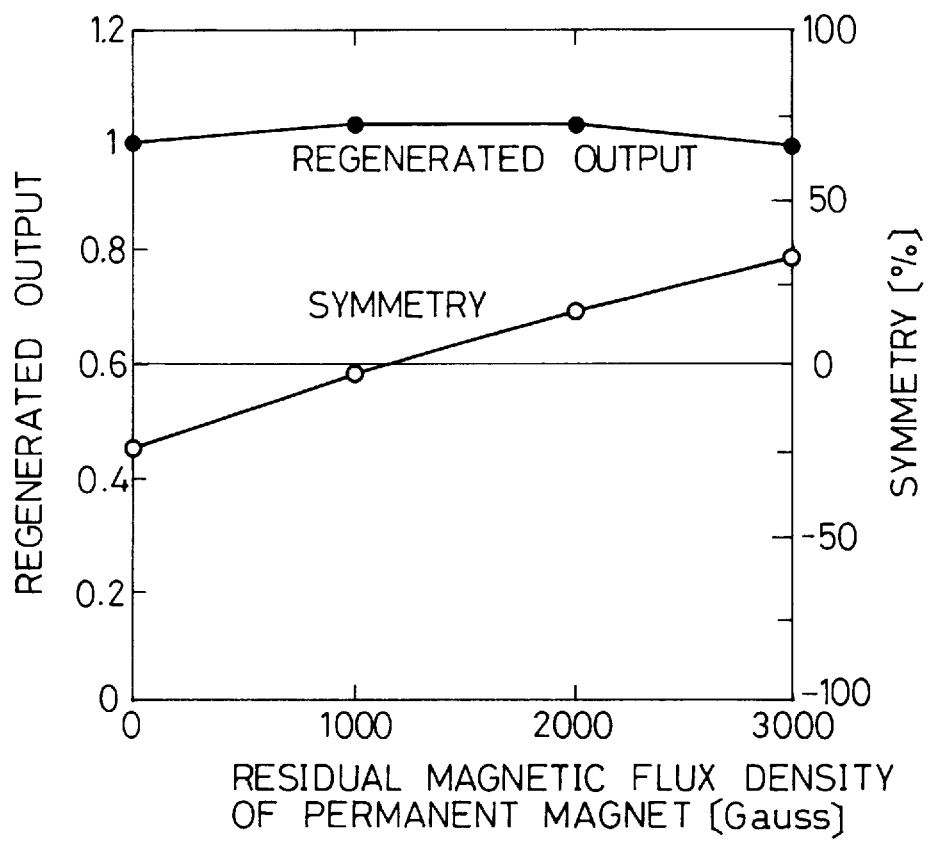
FIG. 7 is a graph showing the dependency of regenerated outputs and symmetry of regenerated waveforms on a bias field in a permanent magnet bias system.

FIG. 7 shows regenerated outputs and symmetry of regenerated waveforms in the case that a bias field is applied to a magnetoresistive effect element by means of the permanent magnet bias system. The regenerated outputs are normalized ones. The intensity of a bias field is controlled by varying residual magnetic flux of a permanent magnet(s). It can be understood that the symmetry of regenerated waveforms is gradually improved by appliance of a bias field.

Figure 8:
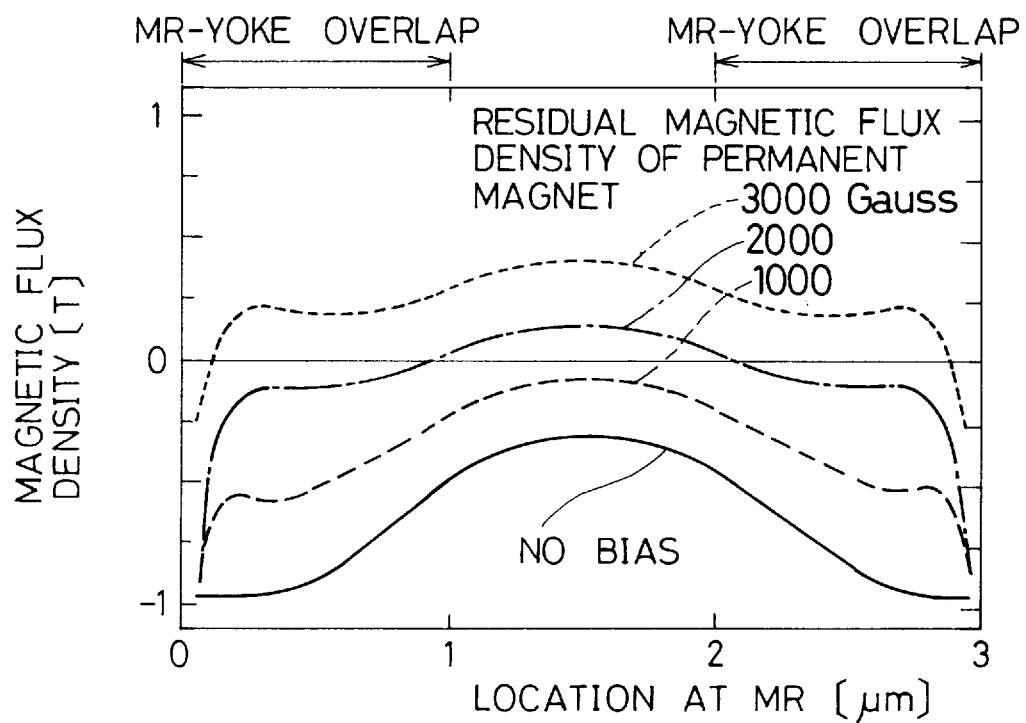
FIG. 8 is a graph showing the dependency of internal magnetization of the second layered thin magnetic layer on a bias field in a permanent magnet bias system.

FIG. 8 shows the results of calculation of magnetization of an internal field of the thin magnetic layers by means of the above mentioned magnetization analysis. It can be understood from FIG. 8 that the influence of the magnetostatic coupling is offset by appliance of a bias field, and that the offset is remarkable in particular at the ends of the layer. It has been found that the residual magnetic flux of a permanent magnet(s) for obtaining a bias field having a desired intensity is varied in dependence on the MR height of the magnetoresistive effect element, and that the preferable range thereof is between 1000 G and 5000 G both inclusive.

The results as aforementioned can be found also in the induction field system, soft film bias system and alternate bias system. The above mentioned shunt bias system, the induction field system, the permanent magnet bias system, the soft film bias system and the alternate bias system may be used alone or in combination with each other.

[Embodiment 3]

Figure 9:
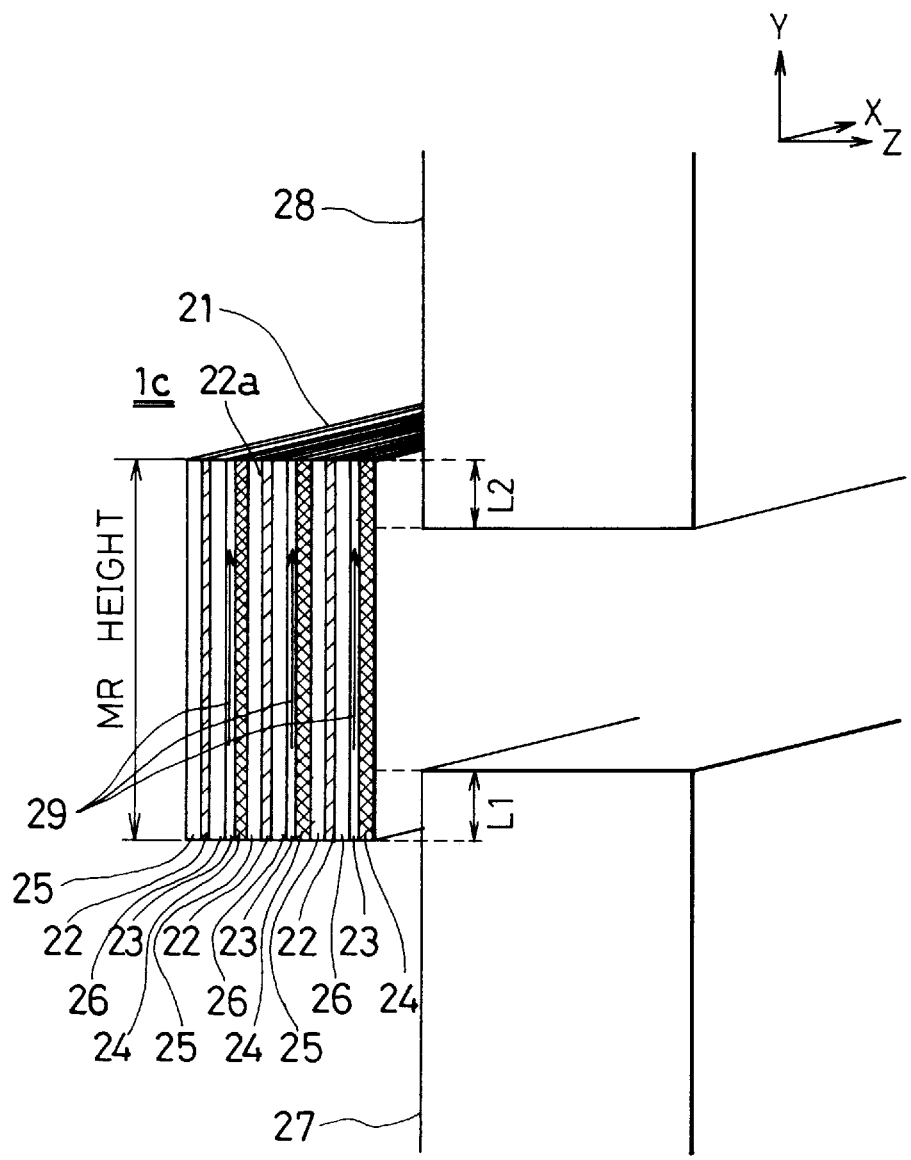
FIG. 9 is a cross-sectional view illustrating a third embodiment of the magnetoresistive effect element in accordance with the invention.

FIG. 9 illustrates a third embodiment of the magnetoresistive effect element 1c in accordance with the invention. The magnetoresistive effect element 1c has a multilayered structure 21 comprising a thin metallic layer 25, a thin magnetic layer 22, a thin non-magnetic layer 26, a thin magnetic layer 23 and a thin antiferromagnetic layer 24 successively deposited three times. It is now supposed that the thin magnetic layer 23, a bias of which is exchanged by the thin antiferromagnetic layer 24, has an antimagnetic force Hex and the thin magnetic layer 22 has a coercive force $H_{C2}$ ($0 < H_{C2} <$ Hex). A Y axis is defined to be an orientation of residual magnetization of the thin magnetic layer 23, and a Z axis is defined to be a direction from the multilayered structure 21 towards yokes 27 and 28 perpendicularly to a surface of the thin magnetic layers 22 and 23. The definition of the Y and Z axes automatically defines a X axis. A sense current is to run through the multilayered structure 21 in a direction of the thus defined X axis. Thus, the magnetization of the thin magnetic layer 23 is oriented in a direction indicated by an arrow 29. The yoke-type magnetoresistive effect element 1c has a finely formed pattern width corresponding to a MR height w. When no current runs through the multilayered structure 21, the orientations of magnetization of the thin magnetic layers 22 and 23 are antiparallel at ends of the multilayered structure 21 due to magnetostatic coupling. In other words, the magnetization of the thin magnetic layer 22 tends to be oriented toward a negative direction of the Y axis, and hence the magnetization of the thin magnetic layer 22 has a magnetization distribution in which the magnetization is oriented toward a negative direction of the Y axis to greater degree at the ends of the multilayered structure 21 than at the center of the multilayered structure 21.

In a magnetoresistive effect element having a yoke, a magnet flux derived from a magnetically recording medium is introduced from a yoke front 27 to a yoke rear 28 through the multilayered structure 21. As aforementioned, the magnetostatic coupling causes the dynamic range relative to a magnetic field generated by the magnetic medium to be smaller at the ends of the multilayered structure 21. Hence, it is necessary for considerably enhancing regenerated outputs to prevent a magnetic field having a large intensity from directly entering the ends of the multilayered structure 21 by covering the ends with the yokes 27 and 28 to thereby introduce a magnetic flux to the center of the multilayered structure having a large dynamic range. What is required for the enhancement of regenerated outputs is to overlap the multilayered structure 21 with the front and rear yokes 27 and 28 for covering only the ends of the multilayered structure 21 which is affected by magnetostatic coupling. Thus, excessively overlapping disadvantageously results in the deterioration of regenerated outputs. That is, the overlapping lengths L1 and L2 of the multilayered structure 21 with the yokes 27 and 28 have optimal values, specifically, L1, L2 $\leq 2.0$ μm, regardless of the MR height w of the multilayered structure 21.

If the MR height w is designed to be 10 μm or greater, the remarkable leakage of magnetic flux from the multilayered structure 21 occurs, and hence the whole multilayered structure 21 is not efficiently magnetized. As a result, regenerated outputs are deteriorated.

In this embodiment, the repeat number N of deposition of layers 25, 22, 26, 23 and 24 is three. However, as mentioned earlier, the repeat number N is preferable to be five or less.

Figure 10:
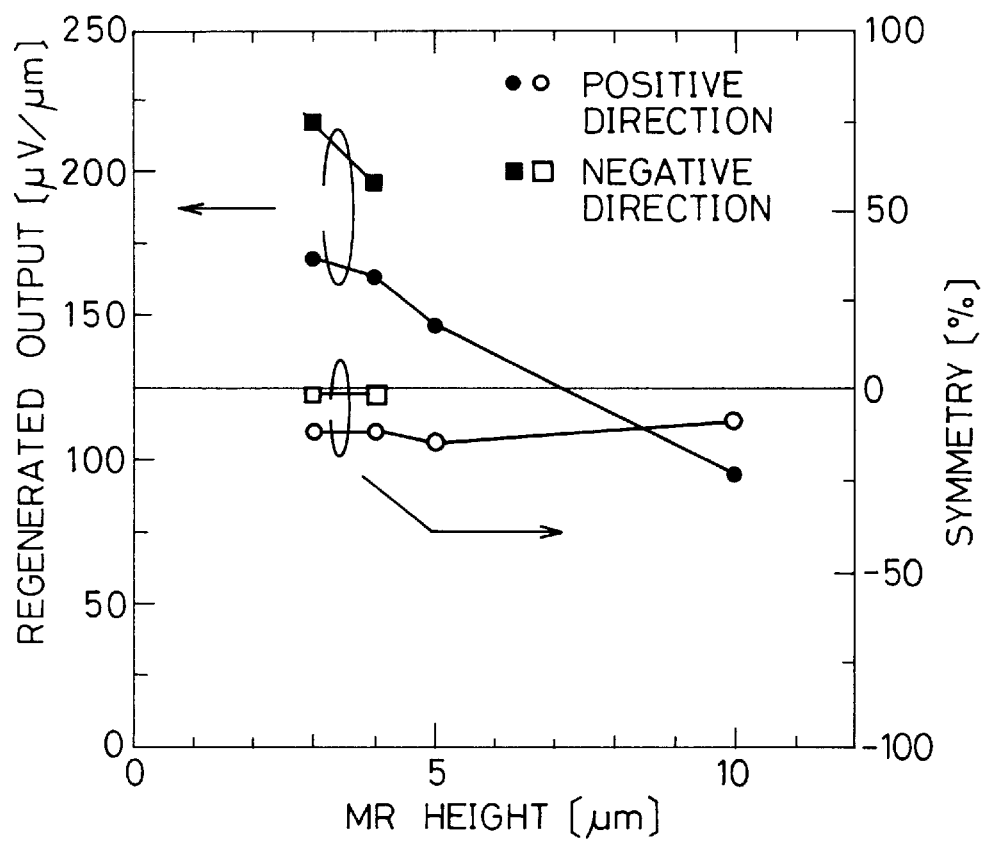
FIG. 10 is a graph showing the dependency of regenerated outputs and symmetry of regenerated waveforms on a direction in which a current runs.

FIG. 10 shows the dependency of regenerated outputs and symmetry of regenerated waveforms on a direction in which an electrical current runs. It can be understood that when a current is to run in a negative direction of the X axis, the significant enhancement of regenerated outputs and the improvement of the symmetry of generated waveforms can be obtained in comparison with a case wherein a current is to run in a positive direction of the X axis.

Hereinbelow will be explained the above mentioned results from the viewpoint of the distribution of internal magnetization of the magnetoresistive effect element. The following is analysis of the magnetization relative to a variation of a signal field due to the two layers deposited medium 17 of the yoke-type MR head to which the magnetoresistive effect element in accordance with the invention is applied. The analysis was carried out using an integral element method. In this analysis, it is supposed that a current runs only through the thin non-magnetic layer 26 at a current density of $1 \times 10^7$ A/cm$^2$, and that a change in an angle formed between the thin magnetic layers 22 and 23 disposed at opposite sides of the thin non-magnetic layer 26 would cause magnetoresistive effect to occur. The resistivity ρ of the thin non-magnetic layer 26 is calculated based on the earlier mentioned equation (A) in which $\rho_0$ represents the resistivity when a magnetic field has an intensity of zero and Δρ represents a variation of the resistivity.

$$\rho = \rho_0 - 0.5 \cdot \Delta\rho \cdot \cos\theta \quad (A)$$

Figure 11:
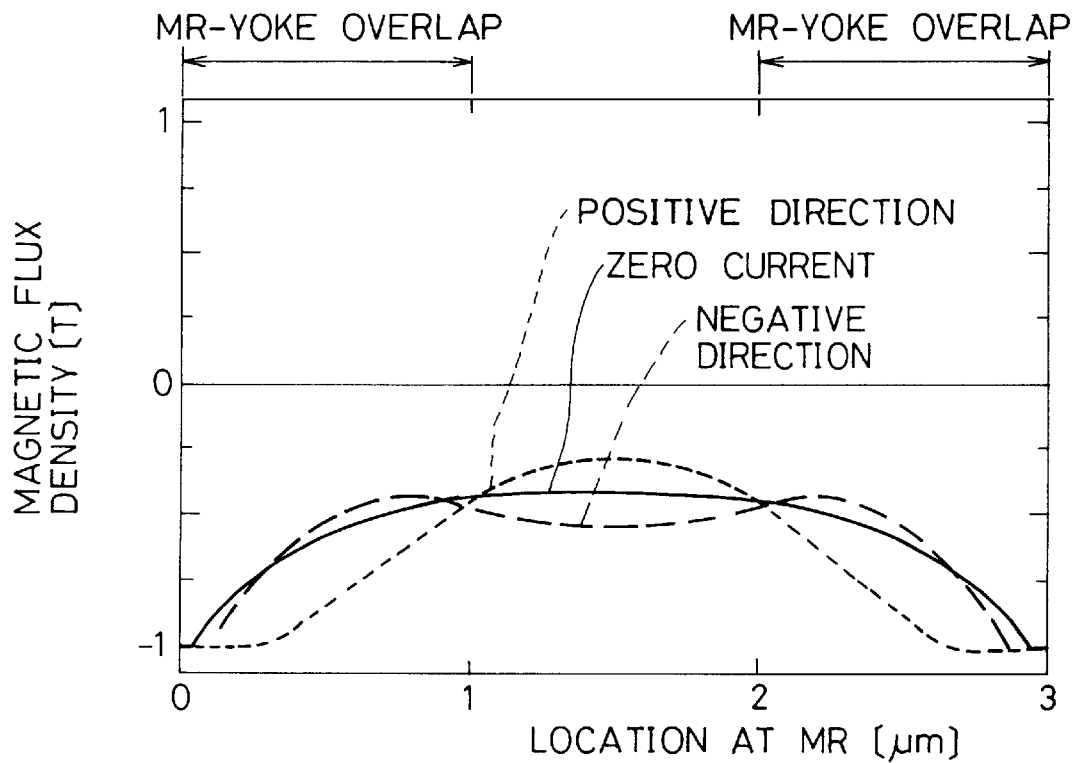
FIG. 11 is a graph showing the dependency of internal magnetization of the second layered thin magnetic layer on a direction in which a current runs.

FIG. 11 shows the dependency of the internal magnetization of the thin magnetic layer 22a on a direction in which a current runs in the case that a magnetic field derived from the record medium 17 is zero. The MR height is 3 μm, and the overlapping length of the multilayered structure 21 with the yokes 27 and 28 is 1 μm. It can be understood that the magnetization is distributed in such a way that the magnetization at the ends of the thin magnetic NiFe layer 22a has an orientation opposite to that of the thin magnetic layer 23 due to the magnetostatic coupling of the thin magnetic layer 22a with the magnetic layer 23.

When a current runs in a positive direction of the X axis, a current field generated by a current running through the thin non-magnetic layers 26 located closer to the yokes 27 and 28 than the thin magnetic layer 22a is gathered to the yokes, and hence the distribution of magnetization of the thin magnetic layer 22a is shifted to be positive in an area at which the multilayered structure 21 overlaps the yokes 27 and 28. On the other hand, a current field generated by a current running through the thin non-magnetic layers 26 located farther away from the yokes 27 and 28 than the thin magnetic layer 22a is scarcely affected by the yokes 27 and 28. Hence, a current field distribution at opposite sides of the thin magnetic layer 22a becomes asymmetrical, and a magnetization distribution in the vicinity of the center of the thin magnetic layer 22a is shifted to be negative.

Figure 12:
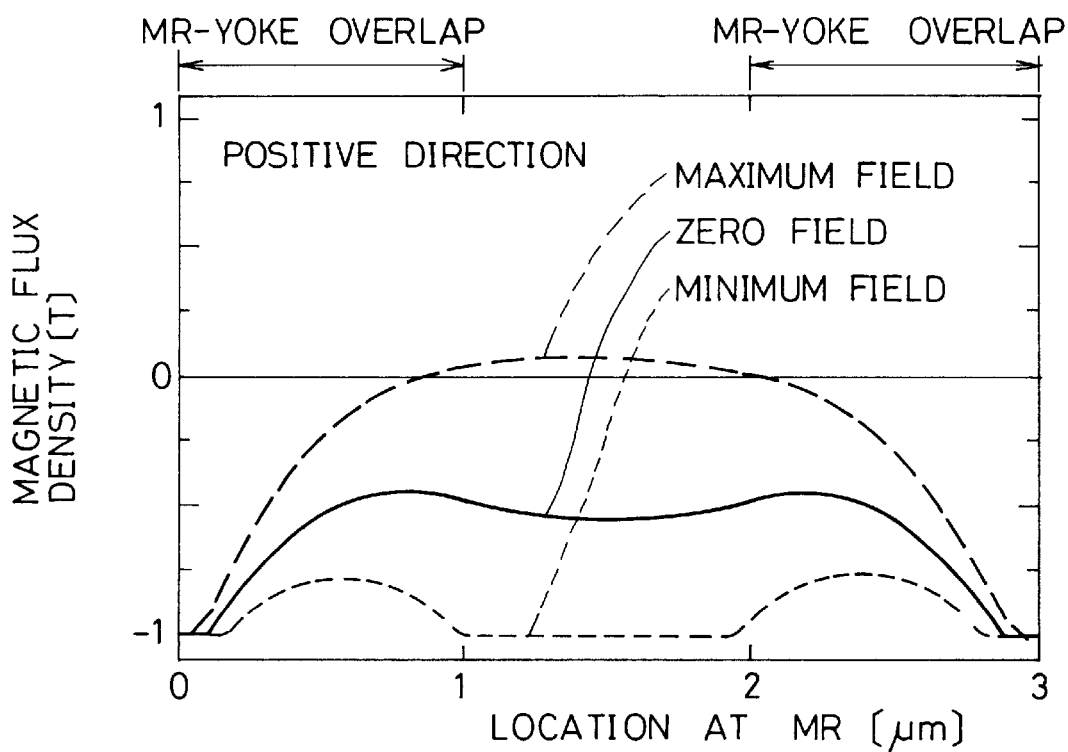
FIG. 12 is a graph showing the dependency of internal magnetization of the second layered thin magnetic layer on a magnetic field derived from a magnetic medium in the case that a current runs in a positive direction of a X axis.
Figure 13:
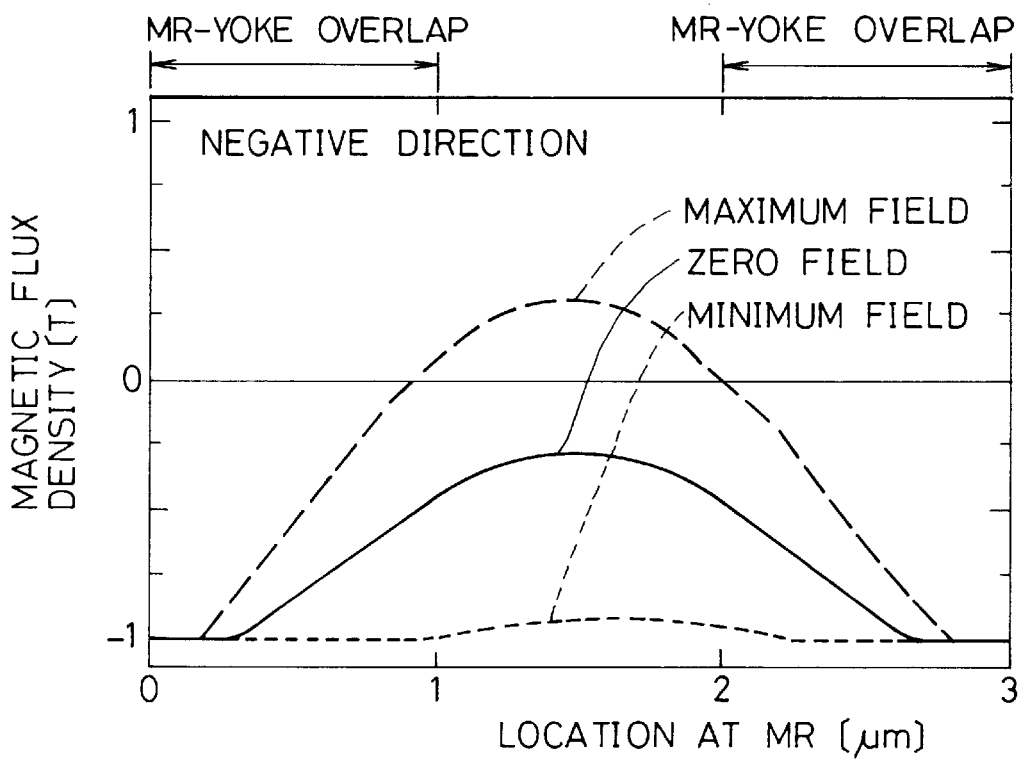
FIG. 13 is a graph showing the dependency of internal magnetization of the second layered thin magnetic layer on a magnetic field derived from a magnetic medium in the case that a current runs in a negative direction of a X axis.

When a current runs in a negative direction of the X axis, the magnetization distribution becomes tortuous in a direction opposite to that of the case wherein a current runs in a positive direction of the X axis. As a result, as shown in FIG. 12, in the case that a current runs in a positive direction of the X axis, the magnetization is saturated, when a magnetic field derived from the record medium is minimum, in the vicinity of the center of the thin magnetic layer 22a having the highest sensitivity to a magnetic field, thereby regenerated outputs are suppressed. On the other hand, as shown in FIG. 13, it can be understood that in the case that a current runs in a negative direction of the X axis, a variation of magnetization can be sufficiently detected.

Figure 14:
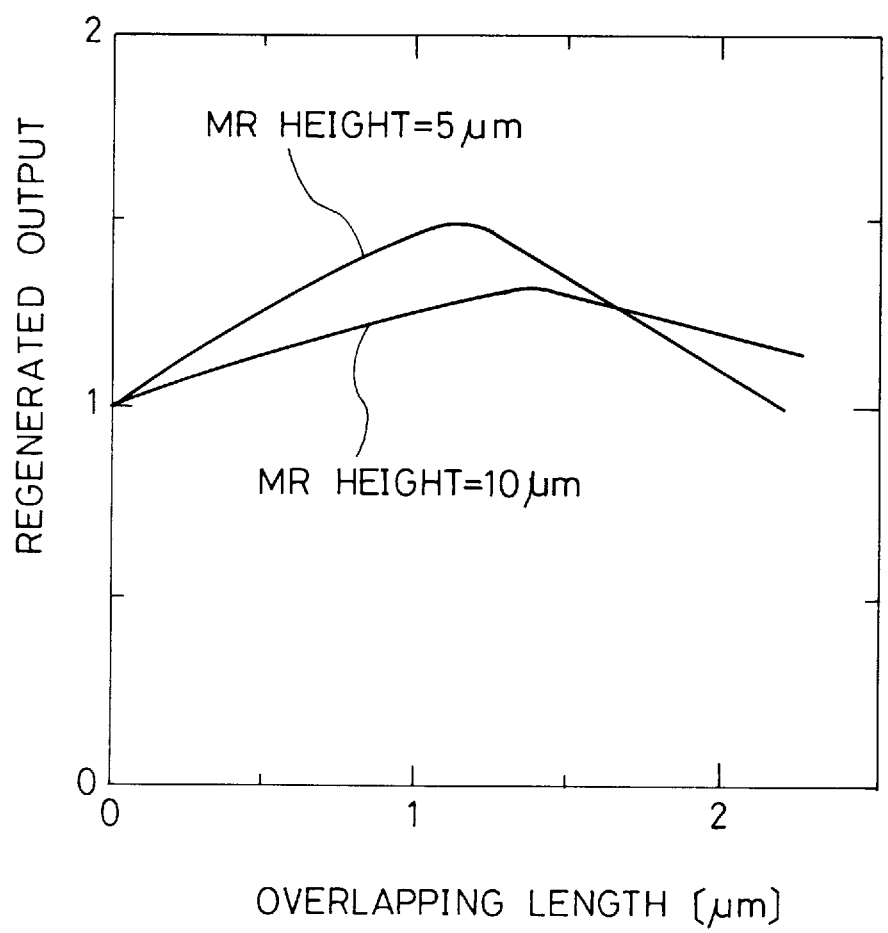
FIG. 14 is a graph showing the relationship between regenerated outputs and an overlapping length of a multilayered structure with yokes.

FIG. 14 shows a relationship between the overlapping length of the multilayered structure 21 with the yokes 27 and 28 and the regenerated outputs in the case of the MR height in the third embodiment is set to be 5 μm and 10 μm. The regenerated outputs are normalized as one obtained when the overlapping length is zero. It can be understood from FIG. 14 that the overlapping length at which the regenerated output is maximum is located between 1.0 μm and 1.5 μm in both cases wherein the MR height is 5 μm or 10 μm. Even when the MR height is not 5 μm and 10 μm, but some other value, the overlapping length L1, L2 at which the regenerated output is maximum is denoted with the following equations.

0<L1 $\leq 2.0$ μm  O<L2 $\leq 2.0$ μm

Figure 15:
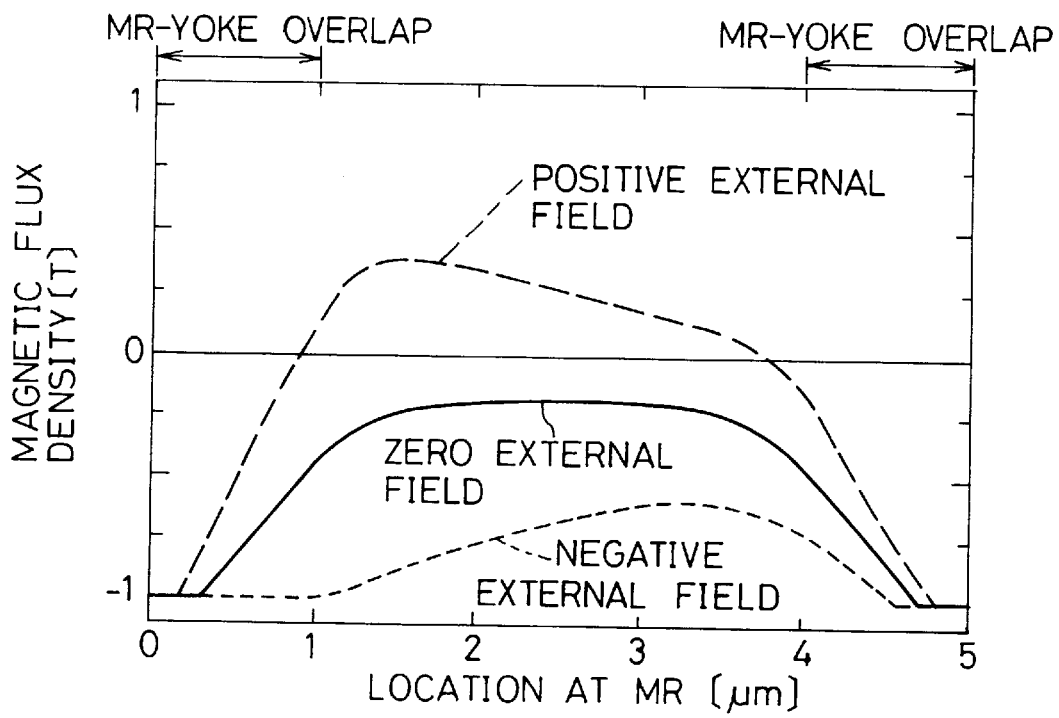
FIG. 15 is a graph showing internal magnetization distribution of the second layered thin magnetic layer in the case that a MR height is 5 μm.
Figure 16:
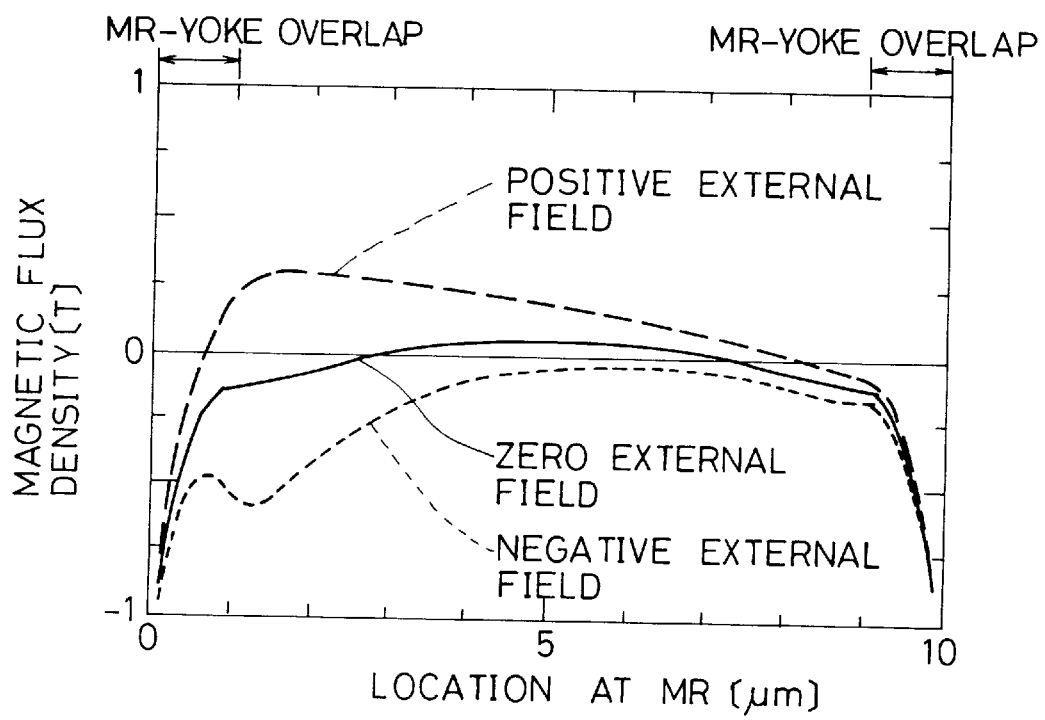
FIG. 16 is a graph showing internal magnetization distribution of the second layered thin magnetic layer in the case that a MR height is 10 μm.

Hereinbelow will be explained the above mentioned results from the viewpoint of the distribution of internal magnetization of the magnetoresistive effect element. The following is analysis of the magnetization relative to a variation of a signal field due to the two layers deposited medium 17 of the yoke-type MR head to which the magnetoresistive effect element 1c in accordance with the invention is applied. The analysis was carried out using an integral element method. In this analysis, it is supposed that a sense current runs only through the thin non-magnetic Cu layer 26 at a current density of $1 \times 10_7$ A/cm$_2$. FIGS. 15 and 16 shows the distribution of internal magnetization in a second magnetic layer 22a in a MR height-wise direction in the case that the MR height is 5 μm and 10 μm, respectively. The repeat number N of deposition is three, and the overlapping length of the multilayered structure 21 with the yokes 27 and 28 is 1 μm. It can be understood that the magnetization is distributed in such a way that the magnetization at the ends of the thin. magnetic layer 22a has an orientation opposite to that of the thin magnetic layer 23 due to the magnetostatic coupling of the thin magnetic layer 22a with the magnetic layer 23. Thus, the dynamic range to an external magnetic field in a negative direction of the Y axis is quite small. The length of the ends of the multilayered structure subject to the magnetostatic coupling remains almost the same in the cases of 5 μm and 10 μm of the MR height. Accordingly, it can be understood that an external magnetic field derived from a magnetic medium is slightly affected by the magnetostatic coupling and thus introduced to the center of the multilayered structure having a large dynamic range by covering the ends of the multilayered structure with the yokes, thereby it is possible to efficiently magnetize the multilayered structure.

Figure 17:
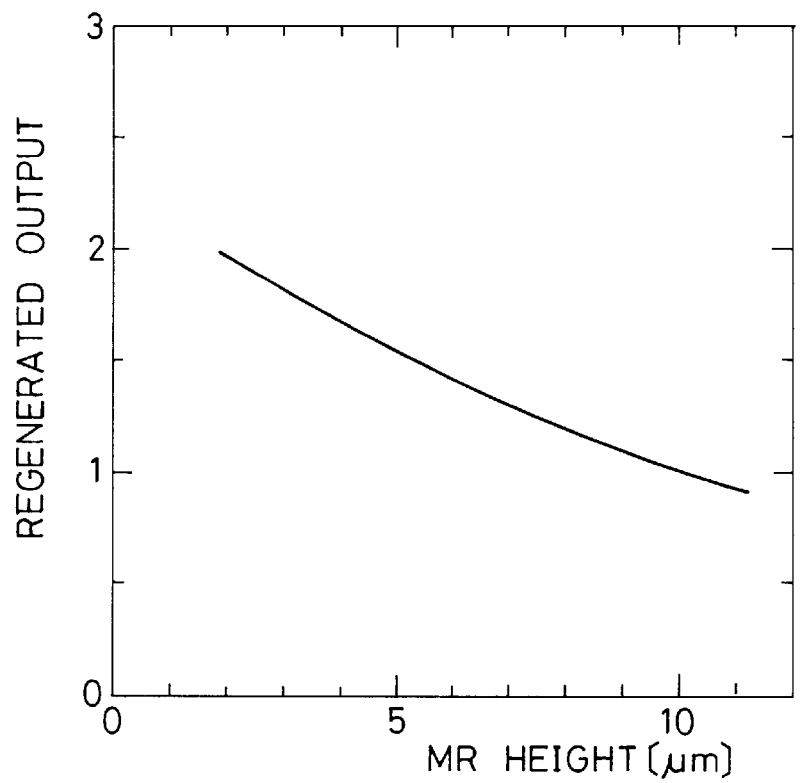
FIG. 17 is a graph showing the relationship between regenerated outputs and a MR height of a multilayered structure.

FIG. 17 shows a relationship between the MR height of the multilayered structure and the regenerated outputs. It can be understood that the remarkable leakage of magnetic flux occurs from the multilayered structure to thereby cause the regenerated outputs to be reduced, when the MR height is 10 μm or more. Accordingly, the MR height is preferable to be 10 μm or less.

Figure 18:
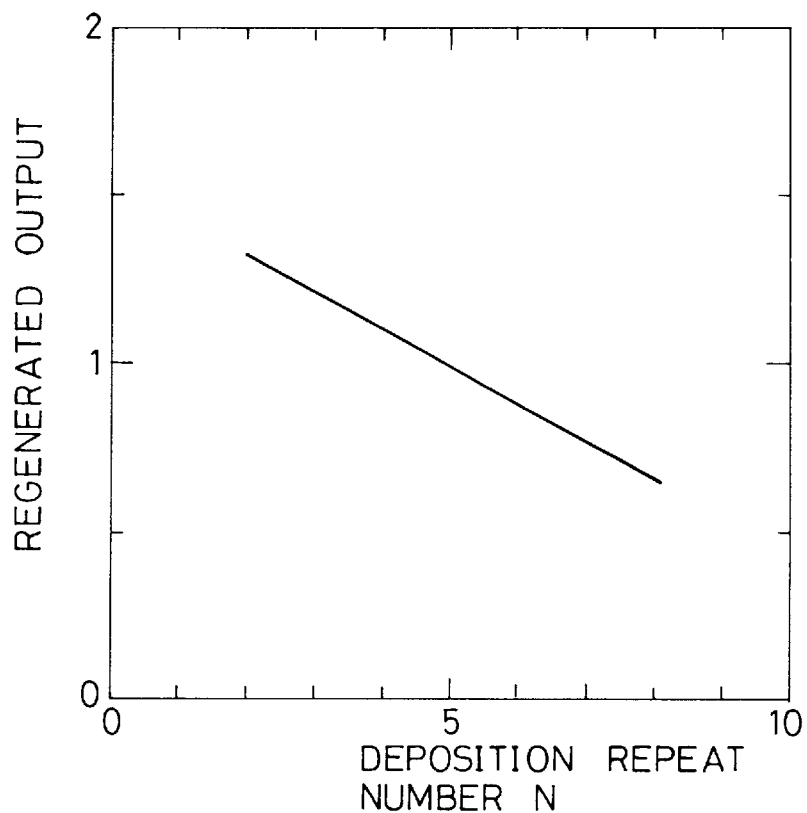
FIG. 18 is a graph showing the relationship between regenerated outputs and the repeat number N of deposition of a multilayered structure.
Figure 19:
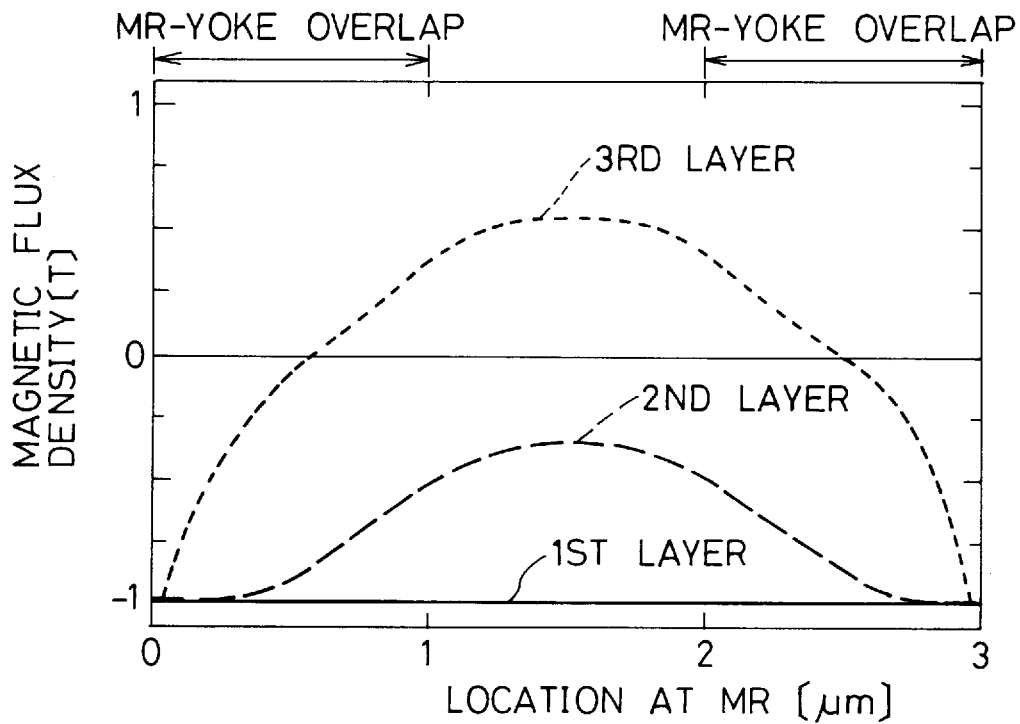
FIG. 19 is a graph showing internal magnetization distribution of the second layered thin magnetic layer in the case that the repeat number N is three.
Figure 20:
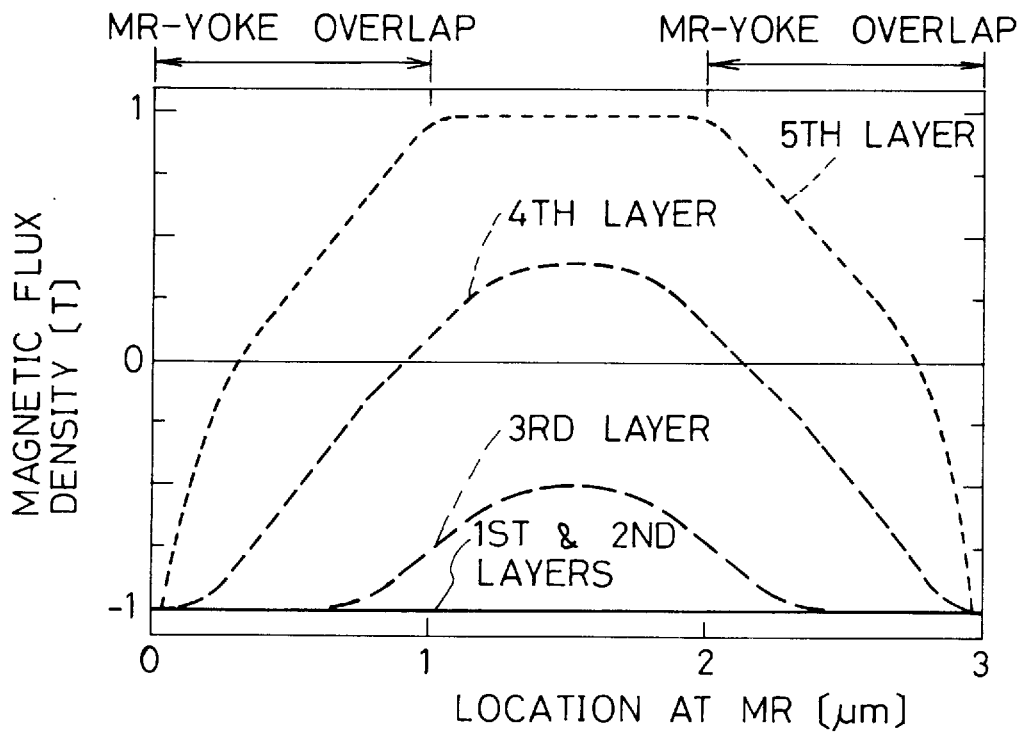
FIG. 20 is a graph showing internal magnetization distribution of the second layered thin magnetic layer in the case that the repeat number N is five.

FIG. 18 shows a relationship between the repeat number N of deposition and the regenerated outputs. It can be understood that the regenerated outputs are decreased in inverse proportion to the repeat number N. Hereinbelow will be explained this relationship. FIGS. 19 and 20 show the distribution of internal magnetization in each of the thin magnetic layers 22 in the case of the repeat number N being equal to three and five, respectively. An external magnetic field derived from the magnetic record medium is zero, the MR height of the multilayered structure 21 is 3 μm, and the overlapping length of the multilayered structure 21 with the yokes 27,28 is 1 μm. With reference to FIG. 19 showing the case that the repeat number N is three, it can be understood that the firstly and thirdly layered magnetic layers 22 are caused by a sense current field to have oppositely directed orientation. In particular, the magnetization of the firstly layered magnetic layer 22 is saturated in a negative direction of the Y axis entirely in a MR height-wise direction. This shows the magnetization of the firstly layered magnetic layer 22 cannot be rotated when an external magnetic field derived from the magnetic medium is oriented in a negative direction of the Y axis. On the other hand, in the case that the repeat number N is five, both of the firstly and secondly layered magnetic layers 22 are saturated in a negative direction of the Y axis. Hence, it can be understood that there are increased magnetic layers which cannot magnetically rotate in response to an external magnetic field derived from the magnetic record medium.

As aforementioned, the greater repeat number N causes the dynamic range to be smaller with the result of the deterioration of the regenerated outputs. Thus, the repeat number N of deposition is preferable to be five or less.

The above mentioned third embodiment is constructed as a yoke-type magnetoresistive effect element, however, it is possible to construct a magnetoresistive effect element as one with a ring-shaped yokes, having a structure as illustrated in FIGS. 4A and 4B. In the magnetoresistive effect element having a ring-shaped yokes, it is possible to reduce the leakage of magnetic flux from the magnetoresistive effect element 1c to the ferromagnetic substrate 11 by setting a distance between a surface from which a magnetic field is to be detected and the multilayered structure to be longer than a gap depth h as defined in FIGS. 4A and 4B. In addition, the gap depth h shorter than 5 μm makes it possible to reduce the leakage of magnetic flux from the front yoke 15 to the ferromagnetic substrate 11 through the gap.

Figure 21:
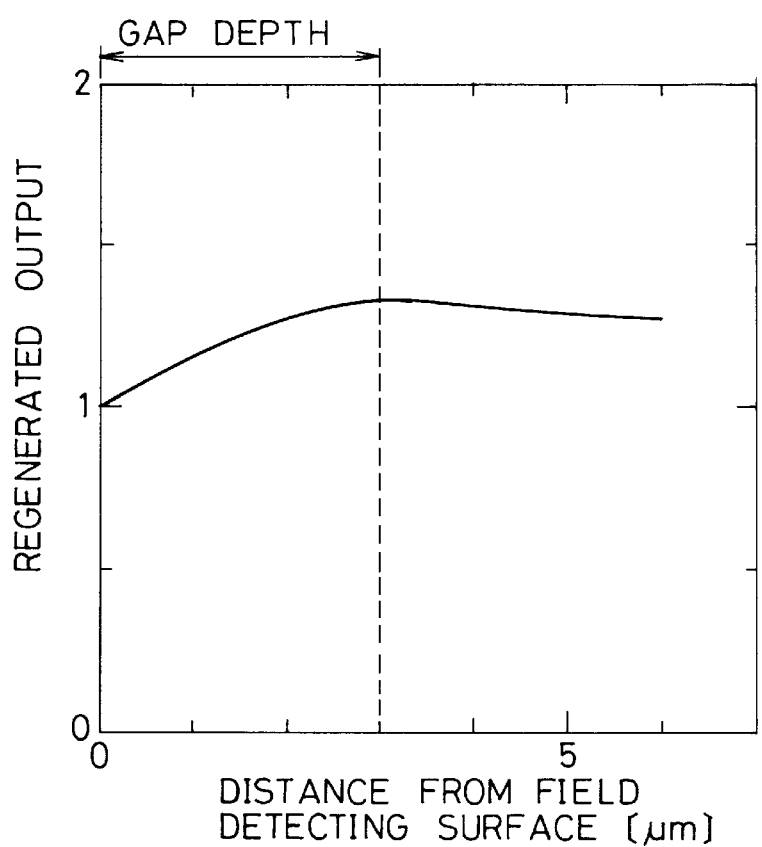
FIG. 21 is a graph showing the relationship between regenerated outputs and a distance between a magnetoresistive effect element and a surface from which a magnetic field is to be detected.

FIG. 21 shows a relationship between regenerated outputs and a distance between the surface from which a magnetic field is to be detected and the multilayered structure in the case that the gap depth h is 3 μm. It can be understood that it is possible to enhance the regenerated outputs by setting the distance mentioned above to be longer than the gap depth h.

Figure 22:
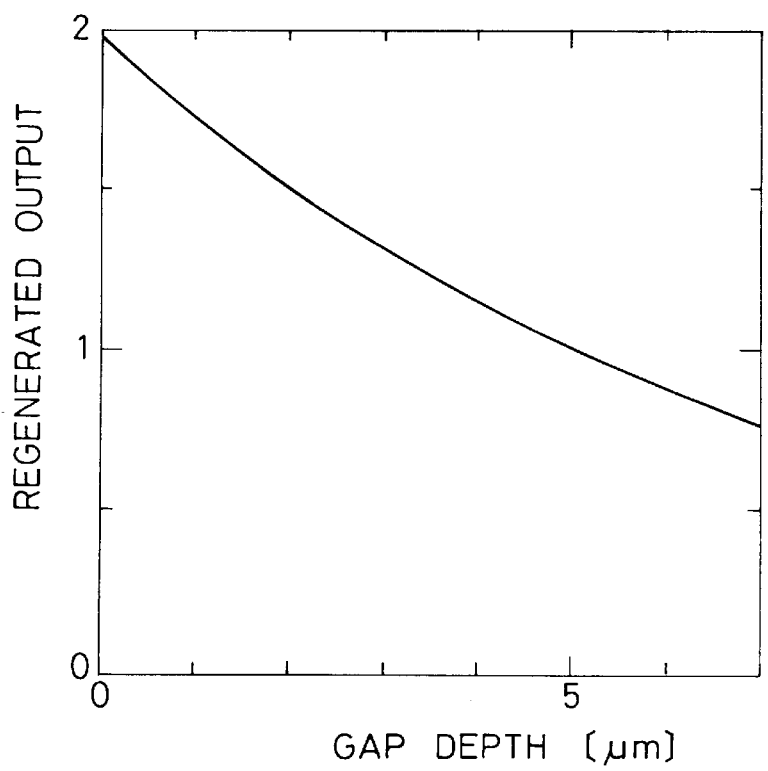
FIG. 22 is a graph showing the relationship between regenerated outputs and a gap depth h of yokes.

FIG. 22 shows a relationship between regenerated outputs and a gap depth h. It can be understood that the regenerated outputs are considerably dependent on the gap depth h, and that the regenerated outputs are increased when the gap depth h is 5 μm or less.

It should be noted that the multilayered structure 1A, 1C or (21) in the preferred embodiments mentioned earlier may be formed so that (a) a thin magnetic layer, a thin non-magnetic layer, a thin magnetic layer and a thin nonmagnetic layer are at least once successively deposited in this order, (b) a thin magnetic layer, a thin non-magnetic layer, a thin magnetic layer and a thin antiferromagnetic layer are at least once successively deposited in this order, or (c) a thin metallic layer, a thin magnetic layer, a thin non-magnetic layer, a thin magnetic layer and a thin antiferromagnetic layer are at least once successively deposited in this order.

While the present invention has been described in connection with, certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A magnetoresistive effect element comprising:

an artificial lattice multilayered structure comprising a thin magnetic layer and a non-magnetic layer at least once successively deposited, one of said the magnetic layers having a coercive force $H_{C2}$, and another thin magnetic layer deposited adjacent to said one of said thin magnetic layer through said non-magnetic layer, having a coercive force $H_{C3}$ which is greater than said coercive force $H_{C2}$ ($0<H_{C2}<H_{C3}$) ; and bias field applying means for applying a bias magnetic field to said artificial lattice multilayered structure in a same orientation and polarity as a residual magnetization of said another thin magnetic layer having coercive force $H_{C3}$, to thereby suppress the influence of magnetostatic coupling in said one of said thin magnetic layer having coercive force $H_{C2}$.

2. The magnetoresistive effect element as recited in claim 1, wherein said bias field applying means includes a shunt layer comprising a non-magnetic layer having a thickness ranging from 2 nm to 20 nm both inclusive.

3. The magnetoresistive effect element as recited in claim 1, wherein said bias field applying means includes a permanent magnet for producing a magnetic field, said permanent magnet having a residual magnetic flux density ranging from 1000 G to 5000 G both inclusive.

4. The magnetoresistive effect element as recited in claim 1, wherein said bias field applying means includes means for generating an induction field by means of an electrical current.

5. The magnetoresistive effect element as recited in claim 1, wherein said bias field applying means includes a soft magnetic film which generates a leakage magnetic field.

6. The magnetoresistive effect element as recited in claim 1, wherein said bias field applying means includes means for running a sense current through two of said artificial lattice multilayered structures to thereby generate the bias magnetic field.

7. A magnetoresistive effect element as recited in claim 1, further comprising:

yokes being overlapped with said artificial lattice multilayered structure at opposite ends of said multilayered structure, an overlapping portion of said yokes with said artificial lattice multilayered structure having a length up to 2.0 μm inclusive.

8. The magnetoresistive effect element as recited in claim 7, wherein said artificial lattice multilayered structure further comprises a thin antiferromagnetic layer so that said artificial lattice multilayered structure is composed of said one said thin magnetic layers, said thin non-magnetic layer, said another thin magnetic layer and said thin antiferromagnetic layer at least once successively deposited in this order.

9. The magnetoresistive effect element as recited in claim 8, wherein said artical lattice multilayered structure further comprises a metallic thin layer so that said artical lattice multilayered structure is composed of said metallic thin layer, said one said thin magnetic layers, said thin nonmagnetic layer, said another thin magnetic layer and said thin antiferromagnetic layer at least once successively deposited in this order.

10. A magnetoresistive effect element as recited in claim 1, further comprising:

yokes positioned relative to said artificial lattice multilayered structure, said artificial lattice multilayered structure having a magnetoresistive height up to 10 μm inclusive.

11. The magnetoresistive effect element as recited in claim 10, wherein said artificial lattice multilayered structure further comprises a thin antiferromagnetic layer so that said artificial lattice multilayered structure is composed of said one of said thin magnetic layers, said thin non-magnetic layer, said another thin magnetic layer and said thin antiferromagnetic layer at least once successively deposited in this order.

12. The magnetoresistive effect element as recited in claim 11, wherein said artificial lattice multilayered structure further comprises a metallic thin layer so that said artificial lattice multilayered structure is composed of said metallic thin layers, said thin magnetic layers, said thin non-magnetic layer, said another thin magnetic layer and said thin antiferromagnetic layer successively at least once deposited in this order.

13. A magnetoresistive effect element as recited in claim 1, further comprising:

a ring-shaped yoke positioned relative to said artificial lattice multilayered structure, a distance between a surface from which a magnetic field is to be detected and said artificial lattice multilayered structure being greater than a gap depth of said ring-shaped yoke, and said gap depth being up to 5 μm inclusive.

14. The magnetoresistive effect element as recited in claim 13, wherein said artical lattice multilayered structure further comprises a thin antiferromagnetic layer so that said artificial lattice multilayered structure is composed of said one of said another thin magnetic layers, said thin non-magnetic layer, said another thin magnetic layer and said thin antiferromagnetic layer at least once successively deposited in this order.

15. The magnetoresistive effect element as recited in claim 14, wherein said artificial lattice multilayered structure further comprises a metallic thin layer so that said artificial lattice multilayered structure is composed of said metallic thin layer, said thin magnetic layer, said thin non-magnetic layer, said another one of said thin magnetic layers and said thin antiferromagnetic layer at least once successively deposited in this order.

16. A magnetoresistive effect element comprising:

an artificial lattice multilayered structure comprising a thin magnetic layer and a non-magnetic layer at least once successively deposited, one of said thin magnetic layers having a coercive force $H_{C2}$, and another thin magnetic layer deposited adjacent to said one of said thin magnetic layers through said non-magnetic layer, having a coercive force $H_{C3}$ which is greater than said coercive force $H_{C2}$ ($0<H_{C2}<H_{C3}$);

yokes positioned relative to said artificial lattice multilayered structure with a non-magnetic insulating layer disposed between said yokes and said artificial lattice multilayered structure; and means for applying an electrical current to said artificial lattice multilayered structure to run said electrical current in a negative direction of an X axis, wherein a Y axis is defined to be a magnetization orientation when a magnetic field is equal to zero after a magnetization of said another thin magnetic layer has been saturated, and a Z axis is defined to be a direction from said artificial lattice multilayered structure towards said yokes perpendicularly to said artificial lattice multilayered structure.

17. The magnetoresistive effect element as recited in claim 16, wherein said yokes are disposed so that said yokes are overlapped with said artificial lattice multilayered structure at opposite ends of said multilayered artificial lattice structure.

18. The magnetoresistive effect element as recited in claim 17, wherein an overlapping portion of said yokes with said artificial lattice multilayered structure has a length up to 2.0 μm inclusive.

19. The magnetoresistive effect element as recited in claim 16, wherein said artificial lattice multilayered structure has a magnetoresistive height up to 10 μm inclusive.

20. The magnetoresistive effect element as recited in claim 16, wherein said artificial lattice multilayered structure further comprises a thin antiferromagnetic layer so that said artificial lattice multilayered structure is composed of said one of said thin magnetic layers, said thin non-magnetic layer, said another thin magnetic layer and said thin antiferromagnetic layer at least once successively deposited in this order.

21. The magnetoresistive effect element as recited in claim 20, wherein said artificial layer multilayered structure further comprises a metallic layer so that said artificial layer multilayered structure is composed of said metallic layers, said thin one of said magnetic layer, said thin non-magnetic layer, said another thin magnetic layer and said thin antiferromagnetic layer at least once successively deposited in this order.

* * * * *

UNITED STATES PATENT AND TRADEMARK OFFICE
CERTIFICATE OF CORRECTION

PATENT NO. : 5,880,911
DATED : March 9, 1999
INVENTOR(S) : Kunihiko ISHIHARA, Hidefumi YAMAMOTO, Kazuhiko HAYASHI and Jun-Ichi FUJIKATA It is certified that error appears in the above-identified patent and that said Letters Patent is hereby corrected as shown below:

Column 15, line 59, delete "1C or" and insert --1B or 1C--.

Column 16, line 15, delete "the" and insert --thin--; and

Column 16, line 27, delete "layer" and insert --layers--.

Column 17, line 22, delete "layers," and insert --layer, one of--; and

Column 17, line 38, delete "another".

Signed and Sealed this

Twenty-eighth Day of September, 1999

Attest:

Q. TODD DICKINSON

*Attesting Officer*   *Acting Commissioner of Patents and Trademarks*